(12) United States Patent
Yang

(10) Patent No.: US 7,126,360 B1
(45) Date of Patent: Oct. 24, 2006

(54) DIFFERENTIAL SIGNAL ACQUISITION PROBE HAVING RETRACTABLE DOUBLE CUSHIONED PROBING TIPS WITH EOS/ESD PROTECTION CAPABILITIES

(75) Inventor: Kei-Wean C. Yang, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/139,079

(22) Filed: May 27, 2005

(51) Int. Cl.
*G01R 31/02* (2006.01)
(52) U.S. Cl. ..................................... 324/754
(58) Field of Classification Search ............... None
See application file for complete search history.

(56) References Cited

U.S. PATENT DOCUMENTS 4,721,903 A * 1/1988 Harsch et al. ............. 324/72.5
6,704,670 B1   3/2004 McTigue
6,734,689 B1 * 5/2004 Yang ......................... 324/754

OTHER PUBLICATIONS http://www.candox.co.jp/, Candox Systems, Inc., CP400-04 probe, no date.

* cited by examiner

*Primary Examiner*—Paresh Patel
*Assistant Examiner*—Roberto Velez
(74) *Attorney, Agent, or Firm*—William K. Bucher

(57) ABSTRACT

A differential measurement probe has spring loaded probe assemblies and a pressure sensors disposed in a housing. The pressure sensors forms an electrical switch having an electrical AND function for passing an activation signal to a EOS/ESD protection control module in response to axial movement of the housing relative to the probe assemblies. First compressive elements produces first pre-loaded compressive forces and increasing compressive forces on the probe assemblies and second compressive elements produces second pre-loaded compressive forces and increasing compressive forces on the probe assemblies subsequent to the first increasing compressive forces on the probe assemblies.

37 Claims, 16 Drawing Sheets

DIFFERENTIAL SIGNAL ACQUISITION PROBE HAVING RETRACTABLE DOUBLE CUSHIONED PROBING TIPS WITH EOS/ESD PROTECTION CAPABILITIES

BACKGROUND OF THE INVENTION

The present invention relates generally to differential signal acquisition probes and more particularly to a differential signal acquisition probe having individually retractable double cushioned probing tips and electrical over stress (EOS) and electrostatic discharge (ESD) protection capabilities.

Ultra high speed sampling heads used in time domain reflectometry typically dictate extremely low capacitances. This introduces unique problems. Sampling devices are much more sensitive to static discharge residing on a device under test. The small geometry of the sampling diodes in the sampling head often dictate low breakdown voltages. The low parasitic capacitance at the sampling head input means that for a given device under test (DUT) static discharge, there will be a higher transient voltage at the sampler input because of the reduced charge sharing effect. It is therefore important to neutralize any static charge on the device under test before the sampling head input is coupled to the device under test.

U.S. Pat. No. 6,734,689 describes a measurement probe providing signal control for an EOS/ESD protection control module. The measurement probe has a spring loaded coaxial probe assembly and a pressure sensor that work in combination to provide an activation signal to the control module. The spring loaded coaxial cable assembly and pressure sensor are disposed in a probe housing. The spring loaded coaxial probe assembly has a semi-rigid coaxial cable with one end forming a probing tip and the other end having a threaded connector. A flexible coaxial cable is connected to the threaded connector and to the control module. A compression spring is positioned over the semi-rigid coaxial cable with one end secured to the semi-rigid coaxial cable and the other end engaging the probe housing. The compression spring is pre-loaded to apply an initial force to the spring loaded coaxial probe assembly as shown graphically in FIG. 1. FIG. 1 shows the forces applied to the probing tip of the spring loaded coaxial probe assembly during use where "F" is the force applied to the probing tip, $k_1$ is the spring constant, and $\Delta X$ is the displacement of the spring from its equilibrium position. The pre-loading of the compression spring generates an initial force $F_1$ on the coaxial probe assembly. The pressure sensor has one electrical contact attached to the outer shielding conductor of the semi-rigid coaxial cable which is connected to electrical ground via the flexible coaxial cable. The other pressure sensor electrical contact is mounted to the probe housing. An electrical conductor electrically couples the pressure sensor to the control module.

The control modules provides a ground circuit path for the signal conductor of the measurement probe when the activation signal is absent. When the probing tip makes contact with the device under test, any static electricity on the DUT is coupled via the signal conductor to ground via the control module. As downward pressure is applied to probe housing, the coaxial probe assembly retracts into the probe housing. The compression spring exerts increasing pressure on the coaxial probe assembly following Hook's Law of $F=k_1 \Delta X$ where $k_1$ is the spring constant. Continued downward pressure applied to the probe housing results in the pressure sensor contacts making contact. This results in the pressure sensor passing an activation signal which controls switching circuitry in the control module that removes a ground connection on the signal conductor of the measurement probe. Since the pressure sensor contacts are fixed to the semi-rigid coaxial cable and the probe housing, any continued downward pressure on the probe housing transfers the forces to the pressure sensor and the coaxial probe assembly as represented in FIG. 1 by the vertical force line. The excess forces on the pressure sensor and the coaxial probe assembly may result in damage to the pressure sensor or the coaxial probe assembly.

Another example of a signal acquisition probe for TDR applications is the CP400-04, manufactured by Candox System of Japan. This probe has a metal housing in which an insulated signal conductor is disposed. The metal housing has a threaded connector at one end for connecting a signal cable. The other end of the housing has apertures for receiving spring action pogo pins. One pogo pin is coupled to the insulated signal conductor and the other pogo pins are connected to the metal housing. Non-conductive stops are placed on the end of the housing with the pogo pins to limit the travel of the movable contacts to prevent damage to the pogo pins. Assuming that the retractable portion of the pogo pin is pre-loaded, the force on the retractable portion of the pogo pins is similar to that of FIG. 1. The pre-loaded retractable portion has an initial force $F_1$. Downward pressure on the metal housing creates an increasing force on the retractable portion of the pogo pin as represented by line $k_1$. As lone as the probe is vertical to the DUT the electrical characteristic of signal line and the ground lines are the same. If the probe is not normal to the DUT, the one or more of the pogo pins will not be retracted to the same extent as the other and the electrical characteristic of the signal or ground lines will change leading to inaccurate measurements. Further, this probe does not have EOS/ESD protection.

U.S. Pat. No. 6,704,670 describes a wideband measurement probe for single ended and differential active probing of devices under test. The measurement probe includes at least a first typically cylindrical probe barrel. The probe barrel is constructed of an electrically conductive material and extends partially outside of a probe unit housing. A probe barrel nose cone is attached to the exposed probe barrel. The probe nose cone is generally conical in form and made of an insulating material. The longitudinal axis of the probe barrel nose cone extends from the probe barrel at an offset angle from the longitudinal axis of the probe barrel. A typically cylindrical shaped probe tip extends partially out of the end of the probe barrel nose cone and is make of an electrically conductive material. A probe cable having an outer shielding conductor and a central signal conductor is connected to the probe barrel and the probe tip with the outer shielding conductor being connected to the probe barrel and the signal conductor being connected to the probe tip. An elastic compressible element engages the probe barrel and the probe unit housing allowing movement of the probe barrel into and out of the probe unit housing. For a single ended measurement probe, a retractable ground tip is attached to the probe barrel. For a differential measurement probe, two probe barrel and probe nose cone assemblies are positioned side by side in a probe unit housing. Individual elastic compressible elements are provided for each assembly. Individual coaxial cables are attached to each assembly.

The forces exerted on the probe barrel and probe nose cone assemblies are comparable to forces shown in FIG. 1. Assuming that the elastic compressible element or elements are pre-loaded, there in an initial force on the assembly or assemblies as represented by the force $F_1$. Downward force on the probe unit housing exerts an increasing force on the assembly or assemblies until the elastic compressible element or elements are completely compressed or the assembly or assemblies engage a fixed stop as represented by the sloping line $k_1$. Continued downward pressure on the probe unit housing transfers forces to the assembly or assemblies as represented by the vertical force line. The above described measurement probe is used for measuring signal from a device under test. As such, the probe has passive input circuitry that lessens the need for EOS/ESD protection. Therefore, these probes do not ground the signal input to discharge electrostatic voltages on the device under test.

What is needed is a differential measurement probe having EOS/ESD protection capabilities. The differential measurement probe needs to discharge static voltages on a device under test prior to the signal channels of the differential measurement probe being coupled to a sampling head. Further, the differential measurement probe should provide an indication to a user that adequate pressure has been applied to the probe so as to prevent damage to the probe.

SUMMARY OF THE INVENTION

Accordingly, the present invention is a differential measurement probe having first and second coaxial probe assemblies with each coaxial probe assembly having a probing tip. The coaxial probe assemblies are received in a housing with the probing tips extending from one end of the housing. In the preferred embodiment, each of the first and second coaxial probe assemblies are formed of a semi-rigid coaxial cable having a probing tip at one end and a threaded connector at the other end.

First compressible elements are disposed within the housing with one of the first compressible elements engaging the first coaxial probe assembly and applying a first pre-loaded compressive force to the first coaxial probe assembly and a first increasing compressive force by axial movement of the housing relative to the first coaxial probe assembly. The other first compressible element engages the second coaxial probe assembly and applies a first pre-loaded compressive force to the second coaxial probe assembly and a first increasing compressive force by axial movement of the housing relative to the second coaxial probe assembly. In the preferred embodiment, each of the first compressible elements is a compression spring positioned on the semi-rigid coaxial cables of each of the first and second coaxial probe assemblies. One end of the compression springs are fixedly positioned to the semi-rigid coaxial cables and the other ends engage the housing with the compression springs being compressed between the fixed positions on the semi-rigid coaxial cables and the housing to generate the first pre-loaded compressive forces.

First and second pressure sensors are disposed in the housing for passing an activation signal in response to the axial movement of the housing relative to the first and second coaxial probe assemblies. Each of the first and second pressure sensors has a first portion associated with each of the respective coaxial probe assemblies and a second portion associated with the housing. Each of the first and second pressure sensors has a first electrically conductive contact positioned on an outer shielding conductor the semi-rigid coaxial cables of each of the first and second coaxial probe assemblies and a second electrically conductive contact disposed in the housing. One of the first electrically conductive contacts is electrically coupled to the outer shielding conductor of one of the semi-rigid coaxial cables and the other first electrically conductive contact is electrically insulated from the outer shielding conductor of the other semi-rigid coaxial cable. The first and second pressure sensors produce a logical AND function when the first electrically conductive contacts of the first and second pressure sensors engage the second electrically conductive contacts of the first and second pressure sensors.

Second compressible elements are disposed within the housing with one of the second compressible elements applying a second pre-loaded compressive force to the first coaxial probe assembly subsequent to the application of the first increasing compressive force on the first coaxial probe assembly and a second increasing compressive force by further axial movement of the housing relative to the first coaxial probe assembly. The other second compressible element applies a second pre-loaded compressive force to the second coaxial probe assembly subsequent to the application of the first increasing compressive force on the second coaxial probe assembly and a second increasing compressive force by further axial movement of the housing relative to the second and coaxial probe assembly.

The housing preferably has first and second members with at least one member having first and second channels formed therein. The first and second members are joined together to form an internal cavity for receiving the first and second coaxial probe assemblies, the first compressible elements, the second compressible elements and the first and second pressure sensors.

In one embodiment of the differential measurement probe, the first electrically conductive contacts of the first and second pressure sensors are fixedly positioned to the outer shielding conductors of the semi-rigid coaxial cables of the first and second coaxial probe assemblies. Additionally, one of the second electrically conductive contacts of the first and second pressure sensors has a common electrically conductive contact for electrically coupling the second electrically conductive contacts together through one of the first electrically conductive contacts of the first and second pressure sensors. In this embodiment, each of the second compressible elements is a compression spring disposed within a bore of an electrically conductive housing having a movable electrical contact secured within the bore. The compression springs of the second compressible elements are compressed between the electrically conductive housings and the movable electrical contacts to generate the second pre-loaded compressive forces. Each of the electrically conductive housings and the movable electrical contacts form one of the second electrically conductive contacts of the first and second pressure sensors.

In a further embodiment of the differential measurement probe, each of the second compressible elements is an elastomeric material disposed in the housing. Each elastomeric material has one of the second electrically conductive contacts of the first and second pressure sensors disposed adjacent to it. The second electrically conductive contacts of the first and second pressure sensors apply a compressive force on the elastomeric materials to generate the second pre-loaded compressive forces.

In still a further embodiment of the differential measurement probe, each of the first electrically conductive contacts of the first and second pressure sensors are movable along the outer shielding conductors of the semi-rigid coaxial cables of the first and second coaxial probe assemblies. In this embodiment, each of the second compressible elements is a compression spring positioned on the semi-rigid coaxial cables of each of the first and second coaxial probe assemblies. One end of each compression spring is fixedly positioned to the semi-rigid coaxial cable and the other end abuts the first electrically conductive contacts of the first and second pressure sensors. Each of the first electrically conductive contacts engage a spring stop on the semi-rigid coaxial cables with the second compression springs being compressed between the fixed positions and the first electrically conductive contacts of the first and second pressure sensors on the semi-rigid coaxial cables to generate the second pre-loaded compressive forces. Each of the second electrically conductive contacts of the first and second pressure sensors are then fixedly positioned in the housing.

In the preferred embodiment, each of the first and second coaxial probe assemblies further have an attachment plate disposed on the semi-rigid coaxial cable adjacent to the threaded connector. Each attachment plate is secured to an anti-rotation block which is positioned within the housing. A bracket having a top plate and depending sidewalls is secured to one of the attachment plates. At least a first electrical connector receptacle is mounted on the bracket and is electrically coupled one of the first and second pressure sensors by and electrical conductor.

A differential measurement probe is preferably coupled via first and second coaxial cables to at least a first electrical over stress and electrostatic discharge protection control module. The differential measurement probe passes the activation signal to the electrical over stress and electrostatic discharge protection control module for electrically coupling the probing tips of the differential measurement probe to input circuitry of the measurement test instrument. One of the second electrically conductive contacts of the first and second pressure sensors is coupled to the electrical over stress and electrostatic discharge protection control module via the electrical conductor. The probing tips of the first and second coaxial probe assemblies are coupled to electrical ground via the electrical over stress and electrostatic discharge protection control module prior to the first electrically conductive contacts of the first and second pressure sensors engaging the second electrically conductive contacts of the first and second pressure sensors. The probing tips of the first and second coaxial probe assemblies are coupled to the input circuitry of the measurement test instrument when the electrical over stress and electrostatic discharge protection control module receives the activation signal passed by the first and second pressure sensors in response to the first electrically conductive contacts of the first and second pressure sensors engaging the second electrically conductive contacts of the first and second pressure sensors.

The electrical conductor coupling one of the second electrically conductive contacts of the first and second pressure sensors to the electrical over stress and electrostatic discharge protection control module preferably has first and second insulated wire segments. The first insulated wire segment electrically couples one of the second electrically conductive contacts of the first and second pressure sensors to an electrical contact of the electrical connector receptacle mounted on the differential measurement probe. The second insulated wire segment electrically couples an electrical contact of a first electrical plug to an electrical contact of a second electrical plug with the first electrical plug mating with the electrical connector receptacle mounted on the differential measurement probe and the second electrical plug mating with an electrical connector receptacle having a first electrical contact mounted in the electrical over stress and electrostatic discharge protection control module.

The differential measurement probe may also be connected to first and second electrical over stress and electrostatic discharge protection control modules. In this embodiment, the first coaxial cable of the differential measurement probe is coupled to the first electrical over stress and electrostatic discharge protection control module and the second coaxial cable is coupled to the second electrical over stress and electrostatic discharge protection control module. The differential measurement probe passing the activation signal to both of the electrical over stress and electrostatic discharge protection control modules. The electrical conductor then consists of a first insulated wire segment electrically coupling one of the second electrically conductive contacts of the first and second pressure sensors to respective electrical contacts of first and second electrical connector receptacles mounted on the differential measurement probe. Second and third insulated wire segments electrically couple the activation signal to the first and second electrical over stress and electrostatic discharge protection control modules. Each second and third insulated wire segment has first and second electrical plugs with each first and second electrical plug having an electrical contact. The electrical contact of the first electrical plug of the second insulated wire mates with the electrical contact of the first electrical connector receptacle mounted on the differential measurement probe and the electrical contact of the second electrical plug of the second insulating wire mates with an electrical contact of an electrical connector receptacle mounted in the first electrical over stress and electrostatic discharge protection control module. The electrical contact of the first electrical plug of the third insulated wire mates with the electrical contact of the second electrical connector receptacle mounted on the differential measurement probe and the electrical contact of the second electrical plug of the third insulating wire mates with an electrical contact of an electrical connector receptacle mounted in the second electrical over stress and electrostatic discharge protection control module.

The objects, advantages and novel features of the present invention are apparent from the following detailed description when read in conjunction with appended claims and attached drawings.

DETAILED DESCRIPTION OF THE PREFERRED EMBODIMENT

Figure 1:
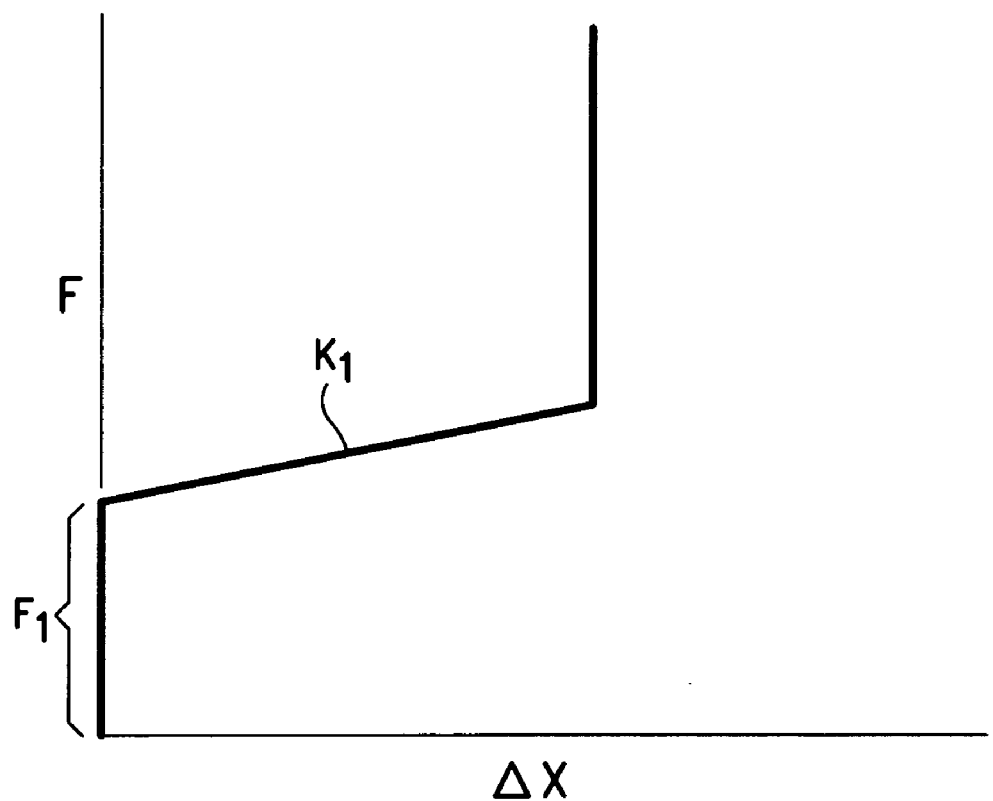
FIG. 1 is a graphical representation of the forces applied to a probing tip of representative existing probe assemblies.
Figure 2:
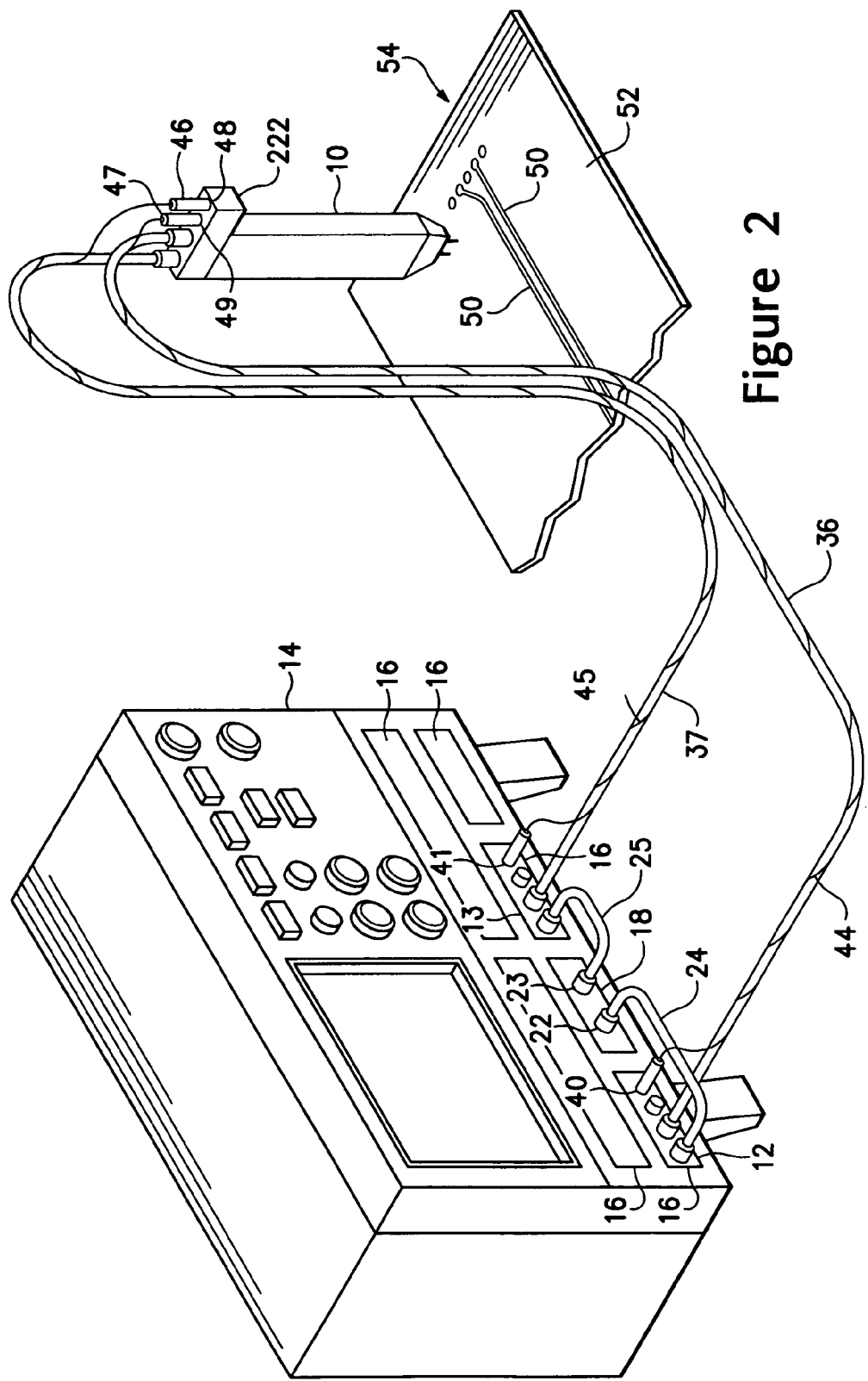
FIG. 2 is a perspective view of a differential measurement probe for passing an activation signal to an EOS/ESD protection control module according to the present invention.

Referring to FIG. 2, there is shown a representative view of a differential measurement probe 10 for passing an activation signal to first and second electrical over stress (EOS) and electrostatic discharge (ESD) protection control modules 12, 13. The control modules 12, 13 are disposed in a measurement test instrument 14, preferably a sampling oscilloscope, such as the TDS82000 Digital Sampling Oscilloscope, manufactured and sold by Tektronix, Inc., Beaverton, Oreg. The digital sampling oscilloscope 14 has a modular architecture that includes multiple bays 16 for receiving various types of optical and electrical plug-in modules 18. The bays 16 provide power, control signals and signal output for the modules. One such module is the 80E04 Dual Channel TDR Sampling Head that is usable for making TDR measurements. The sampling head 18 has input terminals 22, 23 coupled to first and second channel sampling diodes which are terminated in 50 ohms with low parasitic capacitance. The input terminals 22, 23 are coupled via coaxial cables 24, 25 to the respective control modules 12, 13 inserted into bays 16 of the oscilloscope 14.

Figure 3:
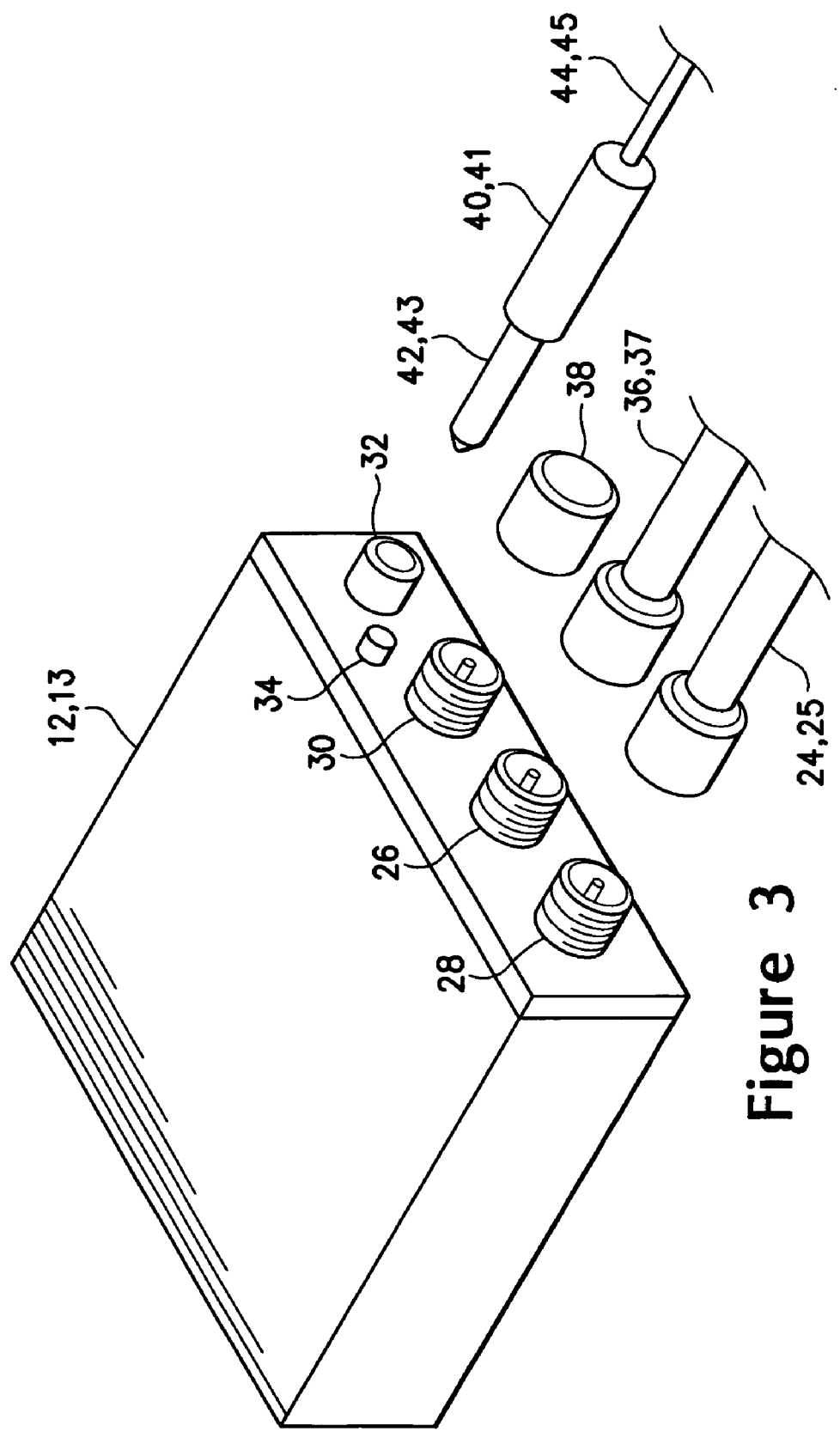
FIG. 3 is a perspective view of a first EOS/ESD protection control module coupled to the differential measurement probe for passing an activation signal according to the present invention.

The respective control modules 12, 13 are best shown in the perspective view of FIG. 3. Each control module 12, 13 has a coaxial input terminal 26, a coaxial output terminal 28, and a coaxial termination terminal 30. An electrically conductive input connector 32 is also provided in the control modules 12, 13. An optional visual indicator 34, such as an LED may be secured to the control modules 12, 13 to indicate when one of the respective probing tips of the differential measurement probe 10 are coupled to the sampling head 18. The coaxial input terminals 26 of the control modules 12, 13 are coupled to one end of respective coaxial cables 36, 37 whose other ends are coupled to the differential measurement probe 10. The coaxial output terminals 28 are coupled by respective coaxial cables 24, 25 to the input terminals 22, 23 of the sampling head 18. A 50 ohm termination connector 38 is secured to the coaxial termination terminal 30. Respective electrically conductive plug connectors 40, 41 plug into the input connector 32. The electrical contacts 42, 43 of the plug connectors 40, 41 are electrically connected to electrical conductors 44, 45 having second plug connectors 46, 47 at the other end. The second plug connectors 46, 47 are plugged into plug receptacles 48, 49 mounted on the differential measurement probe 10. The differential measurement probe 10 is used to probe circuit traces 50 and devices mounted on a circuit board 52 of a device under test 54. The circuit board 52 illustrates tradition G-S-G-S-G contacts with the traces 50 flaring out to the contacts.

Figure 4:
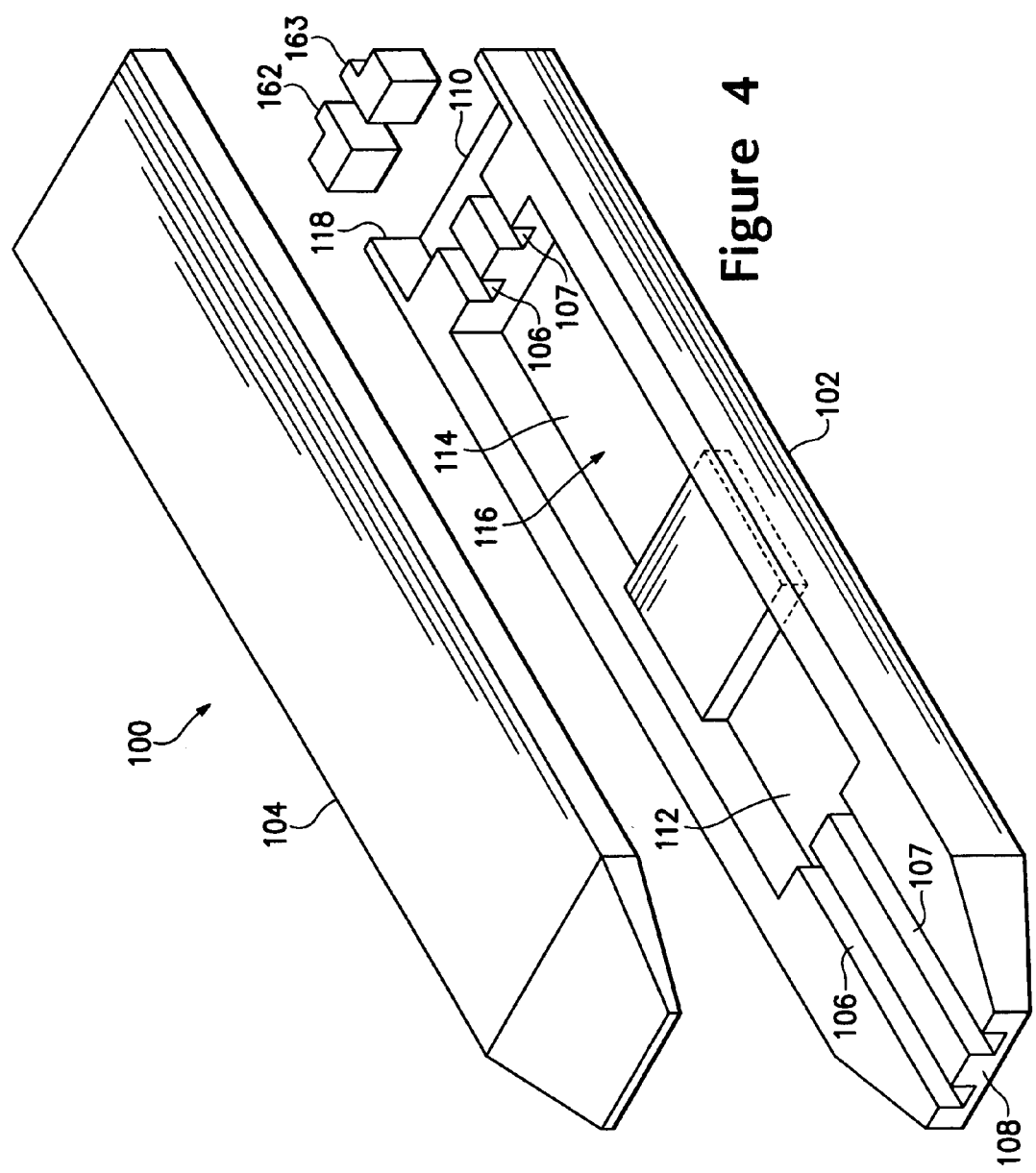
FIG. 4 is a exploded perspective view of the housing for the differential measurement probe for passing an activation signal to an EOS/ESD protection control module according to the present invention.

Referring to FIG. 4, there is shown a exploded view of a housing 100 for a first embodiment of the differential measurement probe 10 for passing an activation signal to EOS/ESD protection control modules 12, 13. The housing 100 is preferably elongate with a rectangular cross-section and made of first and second member 102, 104. The housing 100 is formed of an insulating material, such as ABS plastic, polycarbonate, or the like. At least one of the housing members 102 has first and second channels 106, 107 that are exposed at each end 108, 110 of the housing member 102. Preferably the channels 106, 107 are formed parallel to each other and parallel to the longitudinal axis of the housing member 102. Recesses 112, 114 are formed in the housing member 102 that extend laterally from the channels 106, 107. The channels 106, 107 and recesses 112, 114 form an interior cavity 116 within the housing 100 when the first and second housing members 102 and 104 are attached to each other. The rearward end 110 of the housing has a recess 118 therein for receiving first and second anti-rotation blocks to be described in greater detail below. While the above housing 100 has been described with a channels 106, 107 and recesses 112, 114, 118 formed in one housing member 102, the housing 100 may be formed with channels and recesses in both housing members 102, 104 that form the interior cavity 116 and recess 118 when the housing members are attached to each other.

Figure 5:
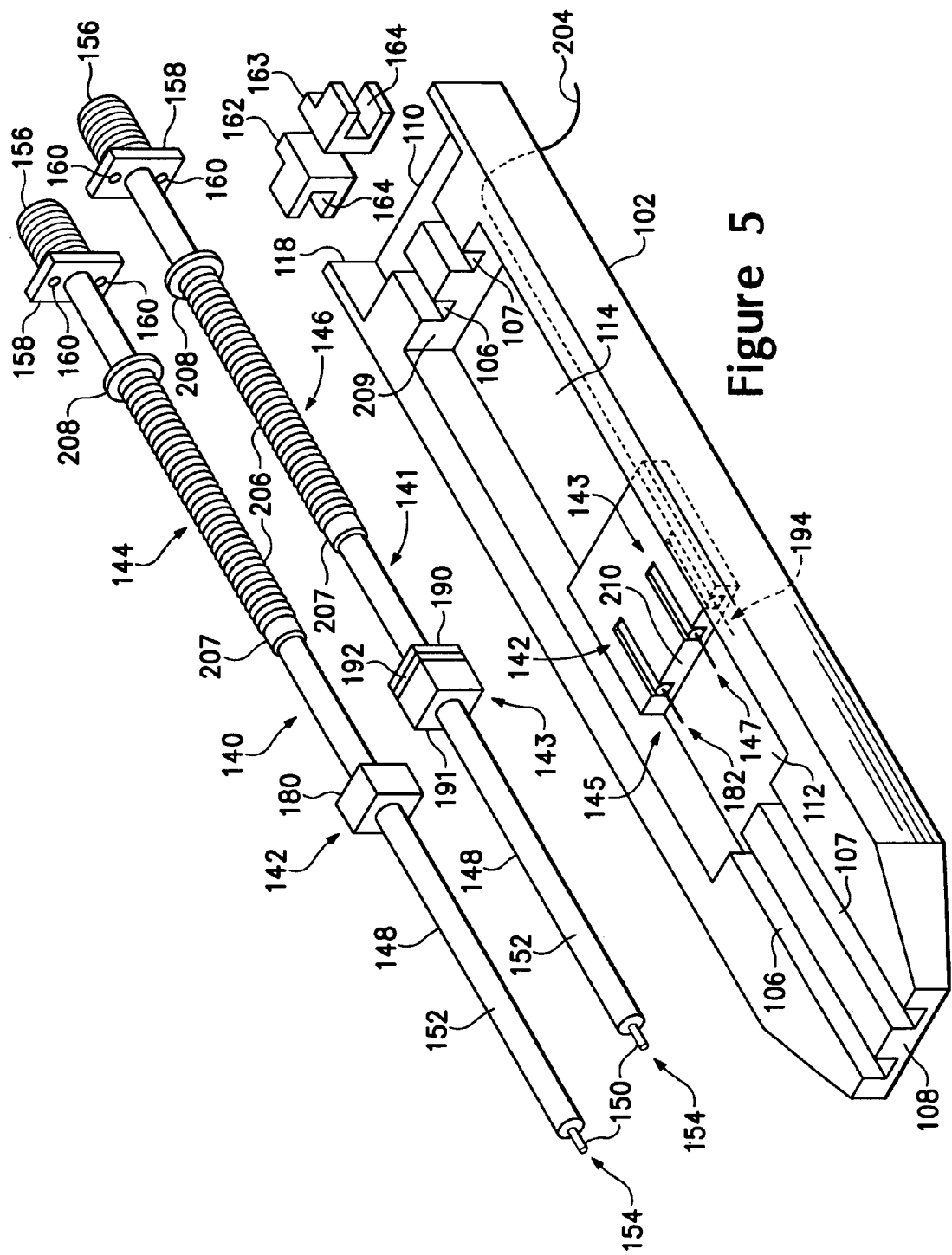
FIG. 5 is a partially exploded view of a first embodiment of the differential measurement probe for passing an activation signal to an EOS/ESD protection control module according to the present invention.

Referring to FIG. 5, there is shown a partial exploded view of first and second coaxial probe assemblies 140, 141, first and second pressure sensors 142, 143 and first and second compressive elements 144, 145 of the first coaxial probe assembly 140 and first and second compressive elements 146, 147 of the second coaxial probe assembly 141 Each of the coaxial probe assemblies 140, 141 has a semi-rigid coaxial cable 148 having a central signal conductor 150 and an outer shielding conductor 152. The central signal conductor 150 extends outward past the outer shielding conductor 152 at one end to form a probing tip 154. A coaxial threaded connector 156 is attached to the other end of the semi-rigid coaxial cable 148 with the threaded portion of the connector 156 coupled to the outer shielding conductor 152 and the central signal conductor 150 coupled to a central conductor being axially disposed within the coaxial threaded connector 156. An attachment plate 158 is attached to the outer shielding conductor 152 adjacent to the coaxial threaded connector 156. The attachment plate 158 is preferably rectangular in shape and had apertures 160 therein for receiving threaded screws. Abutting each attachment plate 158 on the side away from the coaxial threaded connector 156 is an anti-rotation block 162, 163. Each anti-rotation block 162, 163 has a channel 164 formed therein that accepts the semi-rigid coaxial cable 148. The anti-rotation blocks 162, 163 have threaded apertures that receive the threaded screws passing through the apertures 160 of the attachment plates 158 for securing the anti-rotation blocks 162, 163 to the attachment plates 158.

Figure 6:
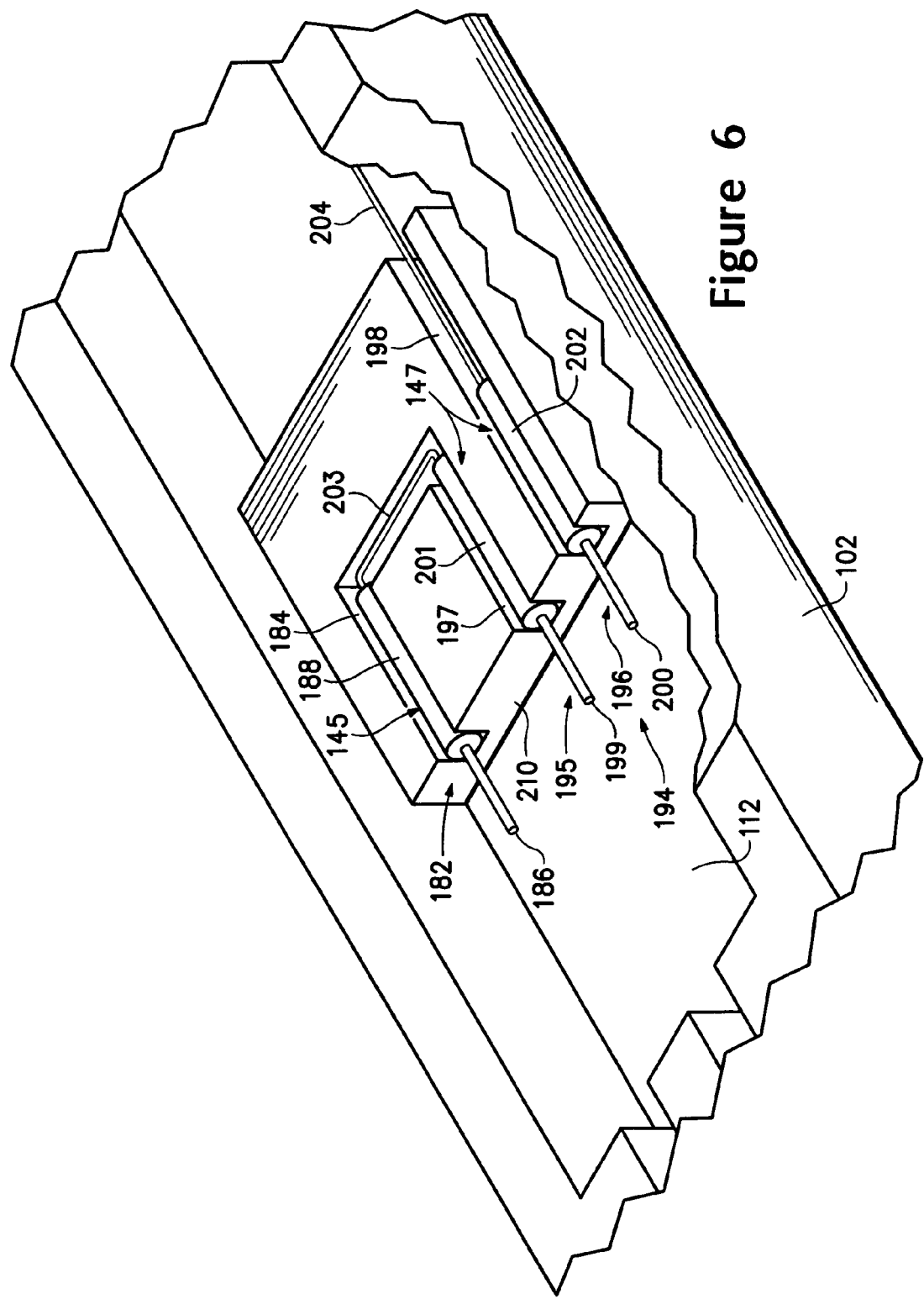
FIG. 6 is a close-up perspective view of the first embodiment of the second electrically conductive contacts of the first and second pressure sensors and the second compressive elements of the differential measurement probe for passing an activation signal to an EOS/ESD protection control module according to the present invention.

The first pressure sensor 142 has a first electrically conductive contact 180 positioned on the semi-rigid coaxial cable 148. The electrically conductive contact 180 is preferably a rectangular shape having a central bore for closely receiving the semi-rigid coaxial cable 148. The first electrically conductive contact 180 is secured to the outer shielding conductor 148 of the semi-rigid coaxial cable using solder, electrically conductive epoxy, or the like. The first electrically conductive contact 180 is preferably made of an electrically conductive material, such as copper, brass, or the like, that is plated with gold. The height of the first electrically conductive contact 180 generally conforms to the height of the recess 112 formed in the housing member 102 and a width sufficient to make contact with a second electrically conductive contact 182 of the first pressure sensor 142. The second electrically conductive contact 182 of the first pressure sensor 142 is disposed within a slot 184 formed in the housing member 102 as best seen in the perspective view of FIG. 6. The slot 184 is aligned parallel with the channel 106 in the housing member 102. The second electrically conductive contact 182 of the first pressure sensor 142 has a movable electrical contact 186 that is disposed within a bore of an electrically conductive housing 188. The second compressive element 145 of the first coaxial probe assembly 140 is also disposed within the bore of the electrically conductive housing 188. The movable electrical contact 186 extends into the recess 112 for making electrical contact with the first electrically conductive contact 180 of the first pressure sensor 142.

The second pressure sensor 143 has a first electrically conductive contact 190 positioned on a rectangular shape block 191 having a central bore for closely receiving the semi-rigid coaxial cable 148. The rectangular shaped block 191 is formed of a hard material, such as brass, aluminum or the like for providing a solid backing surface for the electrically conductive contact 190. An electrically insulating material 192 is disposed between the electrically conductive contact 190 and the block 191 to electrically isolate the contact 190 from the coaxial probe assembly 141. The rectangular shaped block 191 is secured to the outer shielding conductor 148 of the semi-rigid coaxial cable using solder, epoxy, or the like. The first electrically conductive contact 190 is preferably made of an electrically conductive material, such as copper, brass, or the like, that is plated with gold. The height of the block 191 and the first electrically conductive contact 190 generally conforms to the height of the recess 112 formed in the housing member 102 and a width sufficient to make contact with a second electrically conductive contact 194 of the second pressure sensor 143. The second electrically conductive contact 194 of the second pressure sensor 143 consists of two electrically conductive elements 195, 196 that are disposed within slots 197 and 198 formed in the housing member 102. The slots 197, 198 are aligned parallel with the channel 107 in the housing member 102. The electrically conductive elements 195, 196 of the second electrically conductive contact 194 of the second pressure sensor 143 have first and second movable electrical contacts 199, 200 that are disposed within bores of respective electrically conductive housings 201, 202. The second compressive element 145 of the second coaxial probe assembly 140 is also disposed within the bores of the electrically conductive housings 201, 202. The movable electrical contacts 199, 200 extend into the recess 112 for making electrical contact with the first electrically conductive contact 194 of the second pressure sensor 143. An insulated wire 203 electrically couples the electrically conductive housing 188 of the second electrical contact 182 of the first pressure sensor 142 to the electrically conductive housing 201 of the electrically conductive element 195 of the second electrically conductive contact 194. The insulated wire 203 and the electrically conductive element 195 form a common electrical element for coupling the activation signal between the second electrically conductive contacts 182, 194 of the first and second pressure sensors 142, 143 through the first electrically conductive contacts 180, 190. An insulated wire 204 electrically couples the electrically conductive housing 202 to the plug receptacles 48, 49 mounted on the differential measurement probe 10. Alternately, the insulated wire 204 may also be coupled to the electrically conductive housing 188 of the first electrically conductive contact 182 of the first pressure sensor 142 if the first electrically conductive contact 180 of the first pressure sensor 142 is electrically insulated from the semi-rigid coaxial cable 148 of the first coaxial probe assembly 140 and the first electrically conductive contact 190 of the second pressure sensor 143 is electrically coupled to the semi-rigid coaxial cable 148 of the second coaxial probe assembly 141. In the preferred embodiment, the second electrically conductive contact 182 of the first pressure sensor 142 and the electrically conductive elements 195, 196 of the second electrical contact 194 of the second pressure sensor 143 are pogo pins.

Returning to FIG. 5, each of the first compressive elements 144, 146 of the first and second coaxial probe assemblies 140, 141 is a compression spring 206 that is positioned on the semi-rigid coaxial cables 148 of the coaxial probe assemblies 140, 141. One end of the compression springs 206 are preferably held in place on the semi-rigid coaxial cables 148 by a compression spring retention members 207 secured to outer shielding conductors 152 of the semi-rigid coaxial cables 148. Each of the compression spring retention members 207 is preferably a collar that fits over the semi-rigid coaxial cables 148. The collars are formed of a solid material, such as metal, ABS plastic, or the like. The collars are placed on the semi-rigid coaxial cables 148 and secured to the semi-rigid coaxial cables 148 with an adhesive, such as epoxy, Locktite® or the like. The other ends of the compression springs 206 are free to move along the semi-rigid coaxial cables 148. A pressure plate 208 in the form of a washer is preferably positioned adjacent to each of the free ends of the compression springs 206 for engaging the rearward end wall 209 of the recess 114.

The second compressive elements 145, 147 are compression springs disposed within the bores of an electrically conductive housings 188, 201, 202 and captured between the closed ends of the bores and the movable electrical contacts 186, 199, 200. The compression springs are partially compressed in the electrically conductive housings 188, 201, 202 by the movable electrical contacts 186, 199, 200. The partially compressed spring in the electrically conductive housing 188 generates a pre-loaded compressive force $F_2$ on the movable electrical contact 186 as graphically shown in FIG. 7A. An increasing axial force is required on the movable electrical contact 186 to move the electrical contact 186 into the electrically conductive housing 188 as represented by the sloping line $K_2$. The force applied to the movable electrical contact follows Hook's law of $F=K_2 \Delta X$ where $K_2$ is the spring constant and $\Delta X$ is the displacement of the spring from its initial equilibrium position. Each of the partially compressed springs in the electrically conductive housings 201, 202 generates a pre-loaded compressive force $F_3$ on the movable electrical contacts 199, 200 as graphically shown in FIG. 7A. An increasing axial force is required on the each of the movable electrical contacts 199, 200 to move the electrical contacts 199, 200 into the electrically conductive housings 201, 202 as represented by the sloping line $K_3$. The pre-loaded compressive forces and the increasing axial forces on the movable electrical contacts 199, 200 exerted by the compression springs in the electrically conductive housings 201, 202 are additive so that the total pre-loaded compressive force and increasing axial force exerted by the second compressive element 147 on the second coaxial probe assembly 141 is substantially equal to the pre-loaded compressive force and increasing axial force exerted by the second compressive element 145 on the first coaxial probe assembly 140.

Figure 7A:
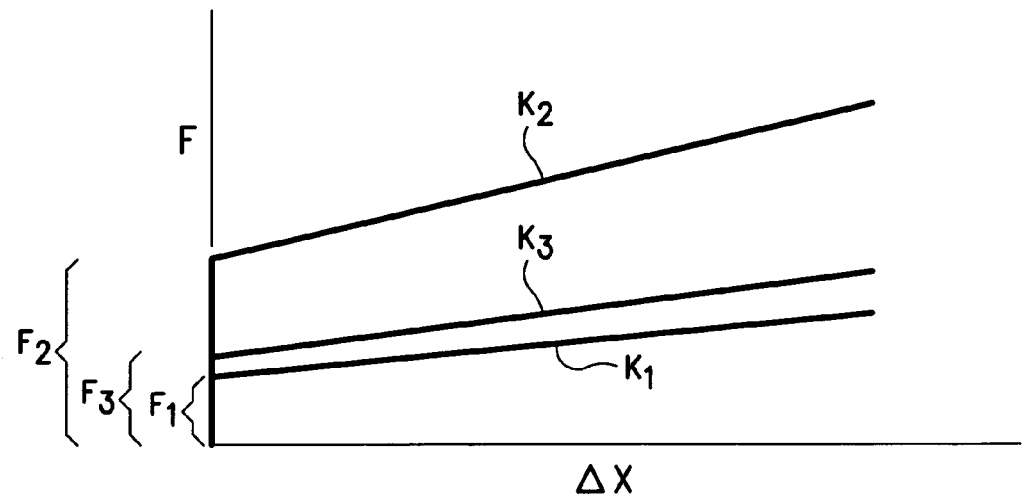
FIG. 7A is a graphical representation of the individual forces applied by the first and second compressive elements to the coaxial probe assemblies in the differential measurement probe for passing an activation signal to an EOS/ESD protection control module according to the present invention.

The coaxial probe assemblies 140, 141 are positioned in the housing member 102 with the probing tips 152 extending out from the end 108 of the housing member 102 and the coaxial threaded connectors 156 extending out from the other end 110 of the housing member 102. The compression springs 206 of the first compression elements 144, 146 are position in the recess 114 with the compression springs 206 being compressed and abutted against the rearward end wall 209 of the recess 114. The first electrically conductive contact 180 of the first pressure sensor 142 and the first electrically conductive contact 190 of the second pressure sensor 143 are positioned in the recess 112. The anti-rotation blocks 162, 163 attached to the coaxial probe assemblies 140, 141 are positioned in the recess 118. The initial compression of the compression springs 206 applies a pre-loaded compressive force $F_1$ on each of the coaxial probe assemblies 140, 141 as represented in the graph of FIG. 7A. An increasing force is required to displace the free ends of the compression springs 206 as represented by the sloping line $K_1$ where $K_1$ is the spring constant of the compression springs 206 and follows Hook's law of $F=K_1 \Delta X$ where $\Delta x$ is the displacement of the spring from its initial equilibrium position.

Figure 7B:
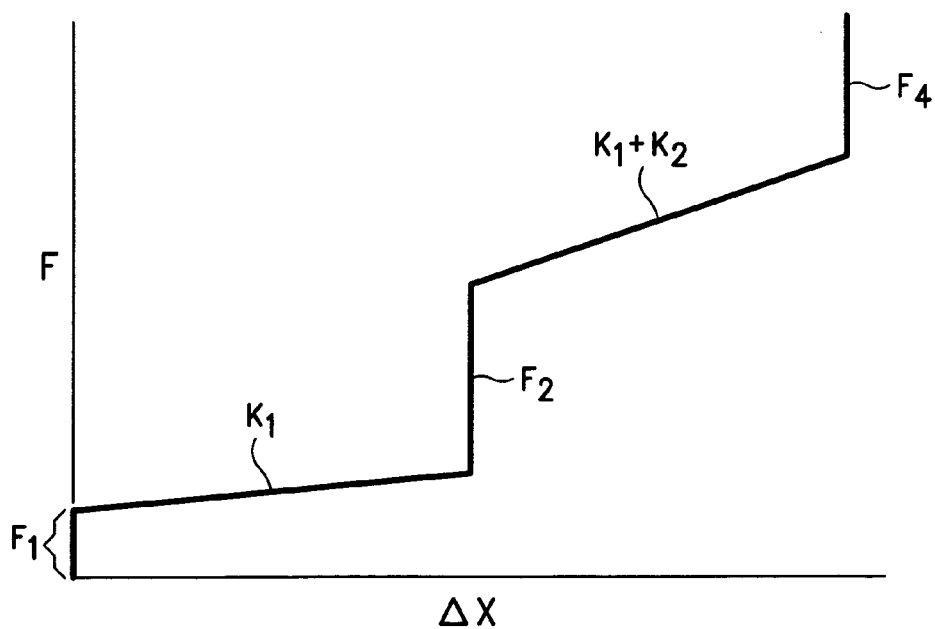
FIG. 7B is a graphical representation of the combined forces applied by the first and second compressive elements to the coaxial probe assemblies in the differential measurement probe for passing an activation signal to an EOS/ESD protection control module according to the present invention.

The coaxial probe assemblies 140, 141 have an initial force applied to them by the pre-loaded compressive forces of compression springs 206 as represented by the force $F_1$ in FIG. 7B. With the probing tips 154 positioned on the device under test 54, downward movement of the probe housing 100 relative to the coaxial probe assemblies 140, 141 causes the rearward end wall 209 of the recess 114 to compress the compression springs 206 as represented by the sloping line $K_1$. The force applied to the coaxial probe assemblies 140, 141 and correspondingly to the probing tips 154 is the combination of the pre-loaded compressive force $F_1$ plus the increasing force required by the spring constant $K_1$ of the compression springs 206.

The downward movement of the probe housing 100 causes the second electrically conductive contact 182 of the first pressure sensor 142 to move toward the first electrically conductive contact 180 of the first pressure sensor 142. Likewise, the downward movement of the probe housing 100 causes the movable electrical contacts 199, 200 of the second electrically conductive contact 194 of the second pressure sensor 143 to move toward the first electrically conductive contact 190 of the second pressure sensor 143. When the first and second electrically conductive contacts 180, 182 of the first pressure sensor 142 are brought into contact, an activation signal is passed to the electrically conductive element 195 of the second electrically conductive contact 194 of the second pressure sensor 143. When the first electrically conductive contact 190 of the second pressure sensor 143 is brought into contact with the movable electrical contacts 199, 200 of the electrically conductive elements 195, 196 of the second electrically conductive contact 194 of the second pressure 143, the activation signal is passed through the second pressure sensor 143 to the plug receptacles 48, 49 via the insulated wire 204. The activation signal is then coupled to the control modules 12, 13 via the electrical conductors 44, 45. At the same time, the compression spring of the second compressive element 145 in the electrically conductive housing 188 generates the pre-loaded compressive force $F_2$ against the first electrically conductive contact 180 of the pressure sensor 142. The pre-loaded compressive force $F_2$ generates an immediate increase in force on the coaxial probe assembly 140 as represented by the vertical force line $F_2$ extending from the $K_1$ line in FIG. 7B. Likewise, each compression spring of the second compressive element 147 in the electrically conductive housings 201, 202 generates the pre-loaded compressive forces $F_2$ against the first electrically conductive contact 190 of the pressure sensor 143. The resulting combined forces of the compression springs in the electrically conductive housing 201, 202 are substantially equal to the compressive force $F_2$ and the spring constant $K_1$ of the compression spring of the second compressive element 145 in the electrically conductive housing 188 as previously stated. The pre-loaded compressive force $F_2$ generates an immediate increase in force on the coaxial probe assembly 141 as represented by the vertical force line $F_2$ extending from the $K_1$ line in FIG. 7B. This increase in force on the coaxial probe assemblies 140, 141 has a noticeable tactile feel to a user for each coaxial probe assembly 140, 141. The user feels the need to apply greater downward force on the probe housing 100 to move the probe housing relative to the coaxial probe assemblies 140, 141. Further, an increasing downward force is required to move the probe housing 100 relative to the coaxial probe assemblies 140, 141 because of the additive properties of the spring constants of the first and second compressive elements as represented by the sloping line $K_1+K_2$. Continued downward force on the probe housing 100 will cause the first electrically conductive contacts 180, 190 of the pressure sensors 142, 143 to abut the rearward end wall 210 of the recess 112. Any continued downward pressure on the probe housing 100 transfers the force directly to the coaxial probe assemblies 140, 141 as represented by the vertical force line $F_4$ and not taken up by the compression springs.

The first and second pressure sensors 142, 143 function as a logical AND gate for passing the activation signal to the plug receptacles 48, 49. If the first and second electrically conductive contacts 180 and 182 of the first pressure sensor 142 engage prior to the first and second electrically conductive contacts 190 and 194 of the second pressure sensor 143, the activation signal will not be passed to the plug receptacles 48, 49. Likewise, if the first and second electrically conductive contacts 190 and 194 of the second pressure sensor 143 engage prior to the first and second electrically conductive contacts 180 and 182 of the first pressure sensor 142, the activation signal will not be passed to the plug receptacles 48, 49. It is only with the first and second electrically conductive contacts of both the pressure sensors 142, 143 engaged will the activation signal be passed to the plug receptacles 48, 49.

The use of the first compressive elements 144, 146 and the second compressive elements 145, 147 provide increased protection for the components of the coaxial probe assemblies 140, 141 as compared to previous differential measurement probes with movable probing tips or housings. The increase in force required to move the probe housing 100 relative to the coaxial probe assemblies 140, 141 due to the second compressive elements 145, 147 provide a user with a tactile indication that sufficient pressure is being applied to the coaxial probe assemblies 140, 141. Further, the second compressive elements 145, 147 provide a pressure safety zone where additional downward force can be applied to the probe housing 100 without running the risk of causing damage to the coaxial probe assemblies 140, 141. Such a pressure safety zone was not available with the prior art probes.

Figure 8:
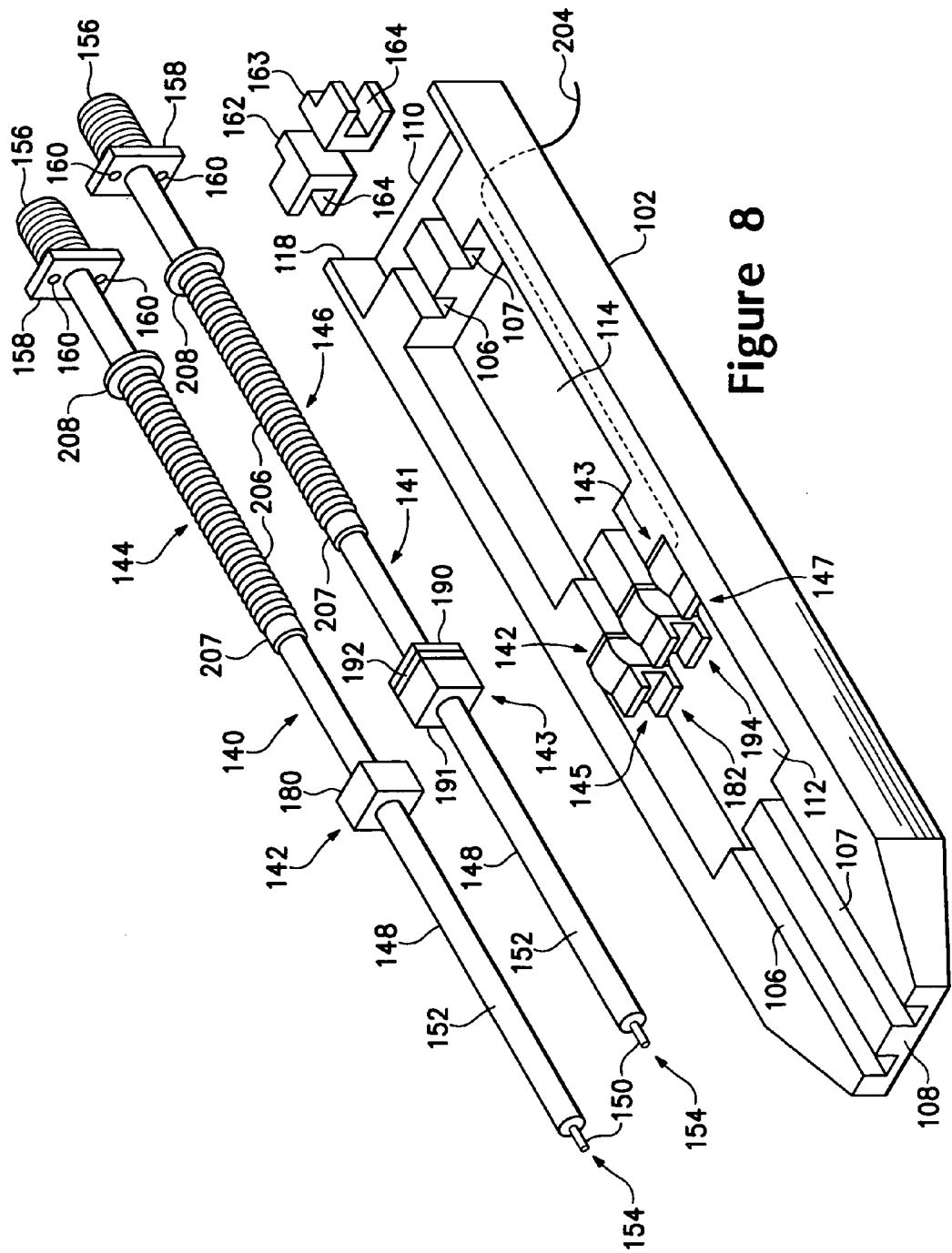
FIG. 8 is partially exploded view of a second embodiment of the differential measurement probe for passing an activation signal to an EOS/ESD protection control module according to the present invention.
Figure 9:
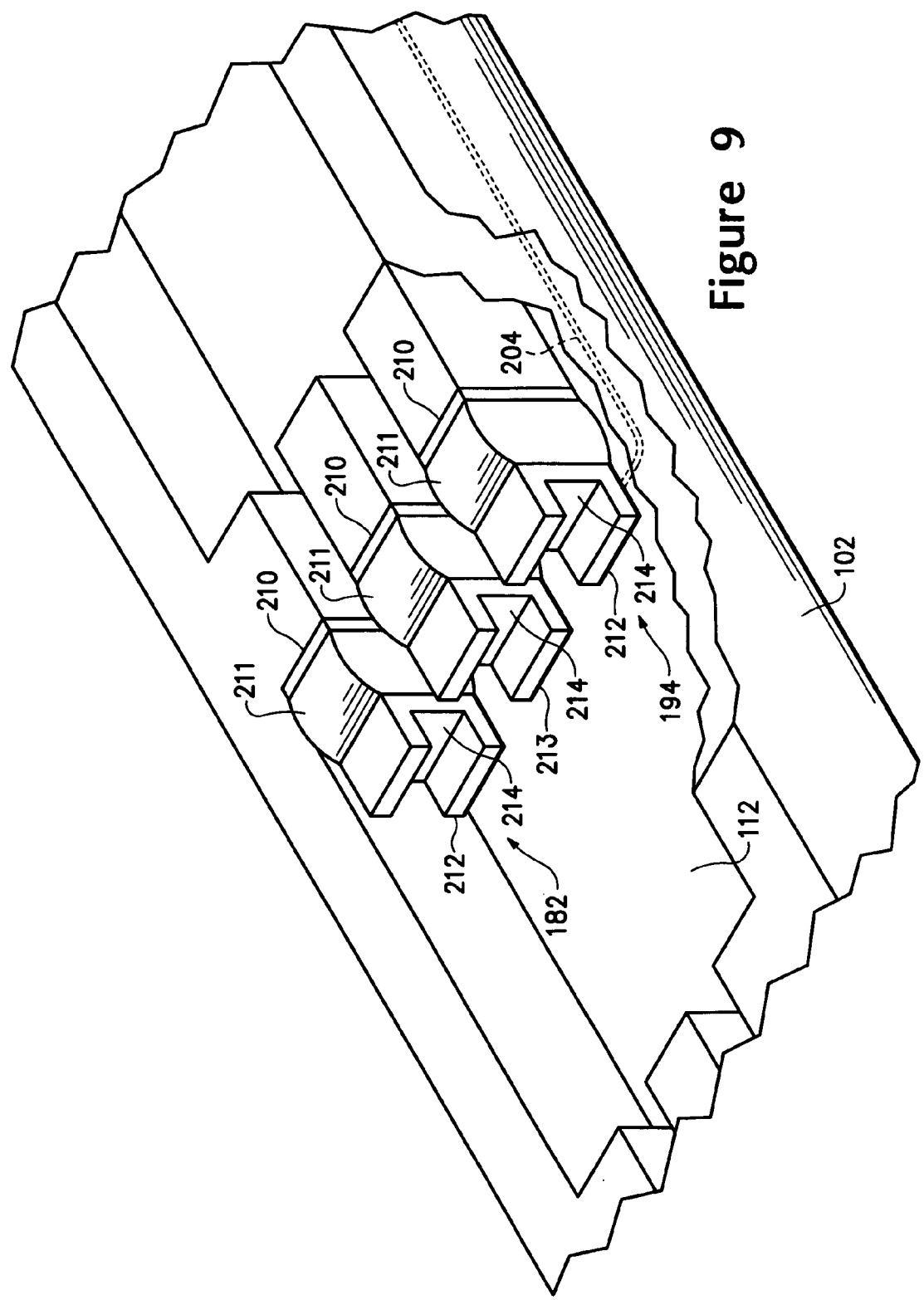
FIG. 9 is close-up perspective view of the second embodiment of the second electrically conductive contacts of the first and second pressure sensors and the second compressive elements of the differential measurement probe for passing an activation signal to an EOS/ESD protection control module according to the present invention.

Referring to FIG. 8, the is shown a second embodiment of the differential measurement probe 10. Like elements from the previous drawing figures are labeled the same in FIG. 8. In this embodiment, the second compressive elements 145, 147 are implemented with elastomeric materials 211, such as a silicon material or the like. The elastomeric materials 211 are disposed adjacent to the rearward end wall 210 of the recess 112. Disposed in front of the elastomeric materials 211 are the second electrically conductive contact 182 of the first pressure sensor 142 and the second electrically conductive contact 194 of the second pressure sensor 143 implemented as a U-shaped conductive elements 212 as best shown in FIG. 9. A U-shaped common conductive element 213 is disposed between the second electrically conductive contacts 182 and 194 for coupling the activation signal between the second electrically conductive contacts 182, 194 through the first electrically conductive contacts 180, 190. The U-shaped conductive elements 212 may be formed of an electrically conductive material, such as brass, copper or the like that is plated with a layer of gold. The base portions 214 of each the U-shaped conductive element 212 has an aperture formed therein for receiving a threaded screw that passes through the elastomeric materials 211 and is secured in the housing member 102. The threaded screws are tightened so that the U-shaped conductive elements 212 apply a force to the elastomeric materials 211 as represented by the pre-loaded compressive force $F_2$ in FIG. 7A. The elastomeric materials 211 exhibits a linear response to an applied force over the range of forces of interest as represented by the line $K_2$ in FIG. 7A. An insulated wire 204 electrically couples the U-shaped conductive element 212 of the second electrically conductive contact 194 of the second pressure sensor 143 to the plug receptacles 48, 49 mounted on the differential measurement probe 10. Alternately, the insulated wire 204 may also be coupled to the U-shaped conductive element 212 of the first electrically conductive contact 182 of the first pressure sensor 142 if the first electrically conductive contact 180 of the first pressure sensor 142 is electrically insulated from the semi-rigid coaxial cable 148 of the first coaxial probe assembly 140 and the first electrically conductive contact 190 of the second pressure sensor 143 is electrically coupled to the semi-rigid coaxial cable 148 of the second coaxial probe assembly 141.

The differential measurement probe 10 with the elastomeric materials 211 for the second compressive elements 145, 147 functions similarly to the previously described operation. The compression springs 206 of the first compressive elements 144, 146 exert a pre-loaded compressive force $F_1$ on the coaxial probe assemblies 140, 141 as represented by the force $F_1$ in FIG. 7B. Downward movement of the probe housing 100 compresses the compression springs 206 as represented by the sloping line $K_1$. As previously stated, the force applied to each of the coaxial probe assemblies 140, 141 and correspondingly to each of the probing tips 154 is the combination of the pre-loaded compressive force $F_1$ plus the increasing force required by the spring constant $K_1$ of the compression springs 206. The downward movement of the probe housing 100 causes the second electrically conductive contacts 182, 194 of the pressure sensors 142, 143 to move toward the first electrically conductive contacts 180, 190 of the pressure sensors 142, 143. When the first electrically conductive contacts 180, 190 of the first and second pressure sensors 142, 143 are brought into contact with the second electrically conductive contacts 182, 194 of the first and second pressure sensors 142, 143 and the common conductive element 213, the activation signal is passed to the plug receptacles 48, 49 via the insulated wire 204. Each of the first electrically conductive contacts 180 and 190 contact one arm of the common electrically conductive element 213. The use of the common conductive elements allows the first and second pressure sensors 142, 143 to function as a logical AND gate for passing the activation signal to the plug receptacles 48, 49. At the same time, the elastomeric materials 211 generates the pre-loaded compressive force $F_2$ against the first electrically conductive contacts 180, 190 of the pressure sensors 142, 143. The pre-loaded compressive force $F_2$ on each electrically conductive contact 180, 190 generates an immediate increase in force on each of the coaxial probe assemblies 140, 141 as represented by the vertical force line $F_3$ extending from the $K_1$ line in FIG. 7B. This increase in force on each of the coaxial probe assemblies 140, 141 has a noticeable tactile feel for a user. The user feels the need to apply greater downward force on the probe housing 100 to move the probe housing relative to the coaxial probe assemblies 140, 141. Further, an increasing downward force is required to move the probe housing relative to the coaxial probe assemblies 140, 141 because of the additive properties of the spring constants of the first compressive elements and the elastic modulus of the elastomeric materials 211 as represented by the sloping line $K_1+K_2$. Continued downward force on the probe housing 100 will further compress the elastomeric materials 211 to that point where any continued downward pressure on the probe housing 100 transfers the force directly to the coaxial probe assemblies 140, 141 as represented by the vertical force line $F_4$.

Figure 10:
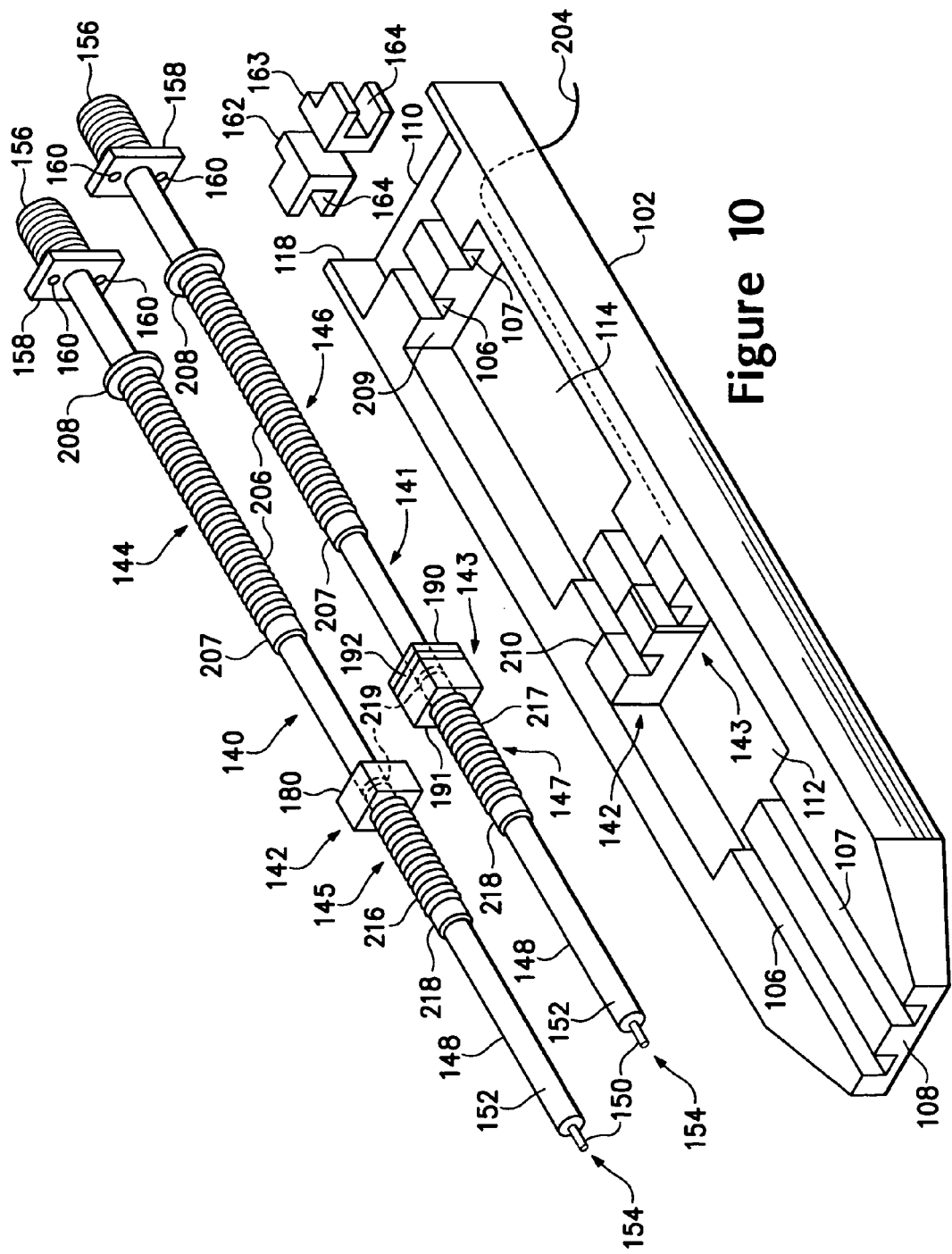
FIG. 10 is partially exploded view of a third embodiment of the differential measurement probe for passing an activation signal to an EOS/ESD protection module according to the present invention.

Referring to FIG. 10, the is shown a third embodiment of the differential measurement probe 10. Like elements from the previous drawing figures are labeled the same in FIG. 10. In this embodiment, the second compressive elements 145 and 147 are implemented as compression springs 216, 217 positioned on the respective semi-rigid coaxial cables 148 of the coaxial probe assemblies 140, 141. One end of each compression spring 216, 217 is preferably held in place on the semi-rigid coaxial cables 148 by a compression spring retention member 218 secured to outer shielding conductor 152 of the semi-rigid coaxial cables 148. The compression spring retention members 218 are similar to the compression spring retainer member 207 previously described. The other end of the compression spring 216 abuts the first electrical contact 180 of the first pressure sensor 142 that is positioned on the semi-rigid coaxial cable 148. The other end of the compression spring 217 abuts the rectangular block 191 that is positioned on the semi-rigid coaxial cable 148 and on which the first electrical contact 190 of the second pressure sensor 143 is secured. The first electrical contact 180 and the rectangular block 191 are free to move along the semi-rigid coaxial cables 148 as compared to the previous embodiments where the first electrically conductive contact 180 and rectangular block 191 are fixed to the semi-rigid coaxial cables 148. The first electrical contact 180 and the rectangular block 191 are positioned on the semi-rigid coaxial cables 148 so as to apply a compressive force on the compression springs 216, 217 resulting in a pre-loaded compressive force $F_2$ as represented in FIG. 7A and FIG. 7B. Second retention members 219 are secured to the semi-rigid coaxial cables 148 to prevent the first electrical contact 180 and the rectangular block 191 from releasing the compressive forces on the respective compression springs 216, 217. An increasing force is required to move the first electrically conductive contact 180 of the first pressure sensor 142 and the first electrically conductive contact 190 mounted on the rectangular block 191 along the semi-rigid coaxial cable due to the spring constants of the compression springs 216, 217 as represented by line $K_2$.

Figure 11:
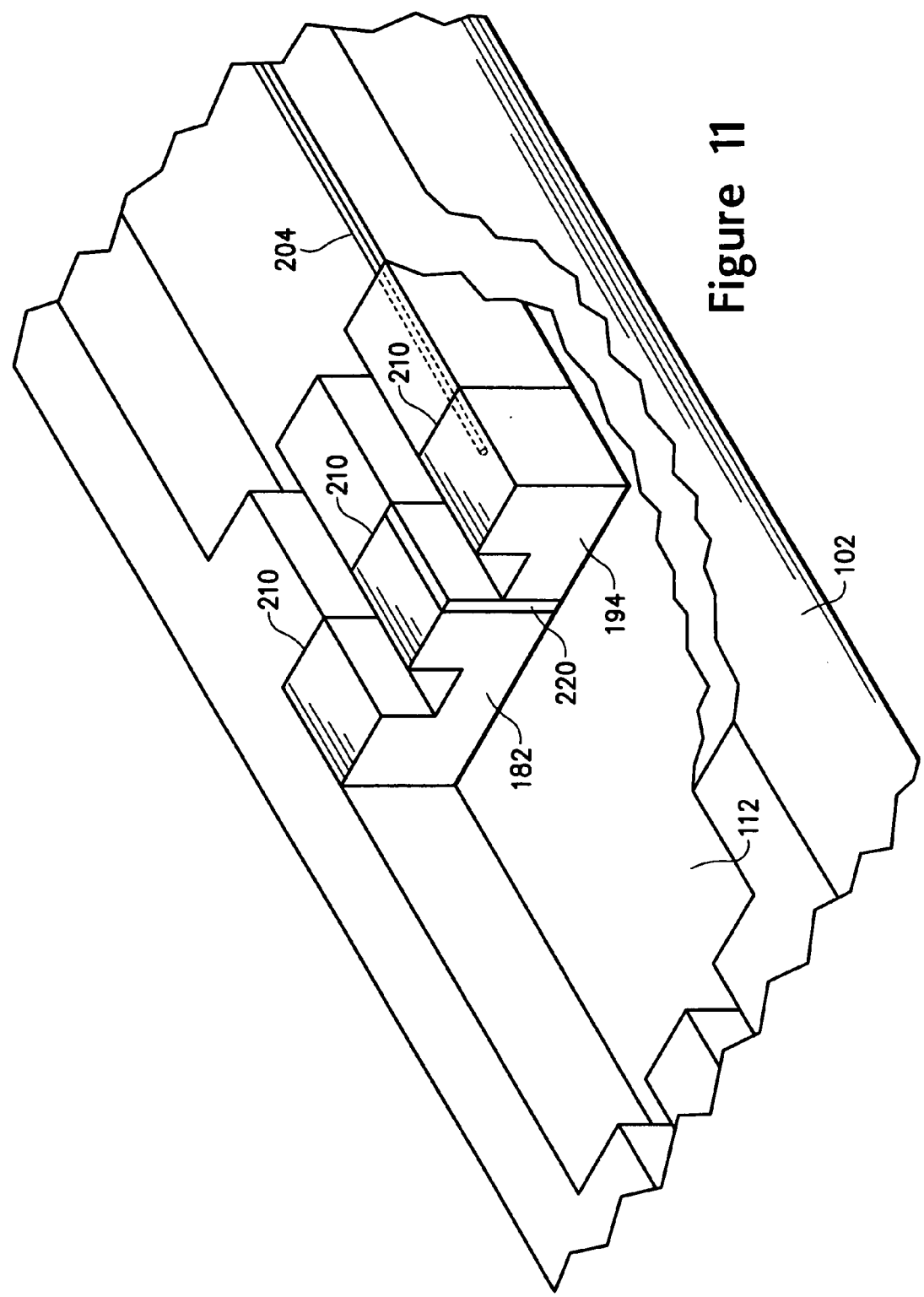
FIG. 11 is close-up perspective view of the third embodiment of the second electrically conductive contacts of the first and second pressure sensors of the differential measurement probe for passing an activation signal to an EOS/ESD protection control module according to the present invention.
Figure 12:
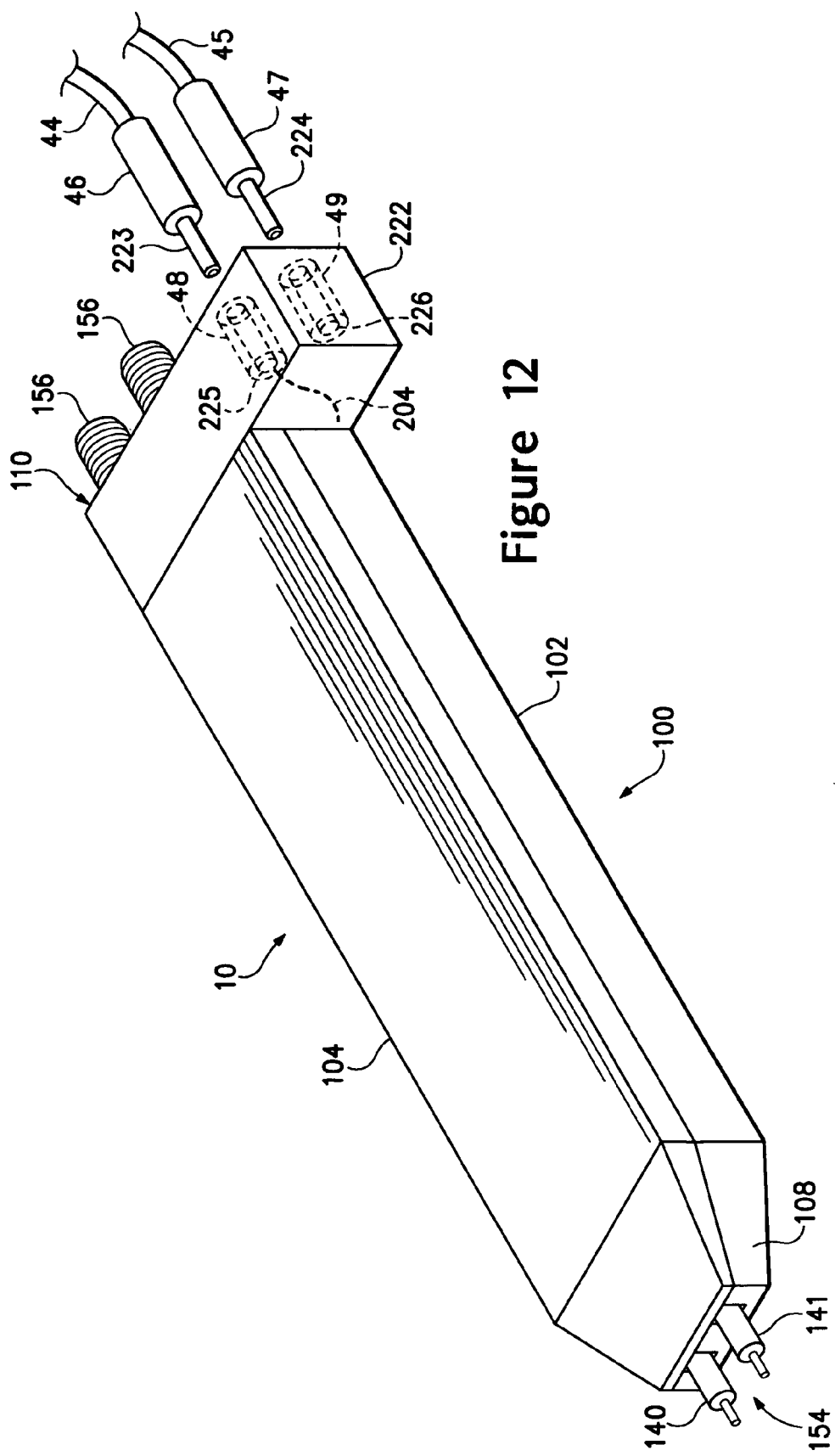
FIG. 12 is a perspective view of the assembled differential measurement probe for passing an activation signal to an EOS/ESD protection control module according to the present invention.
Figure 13:
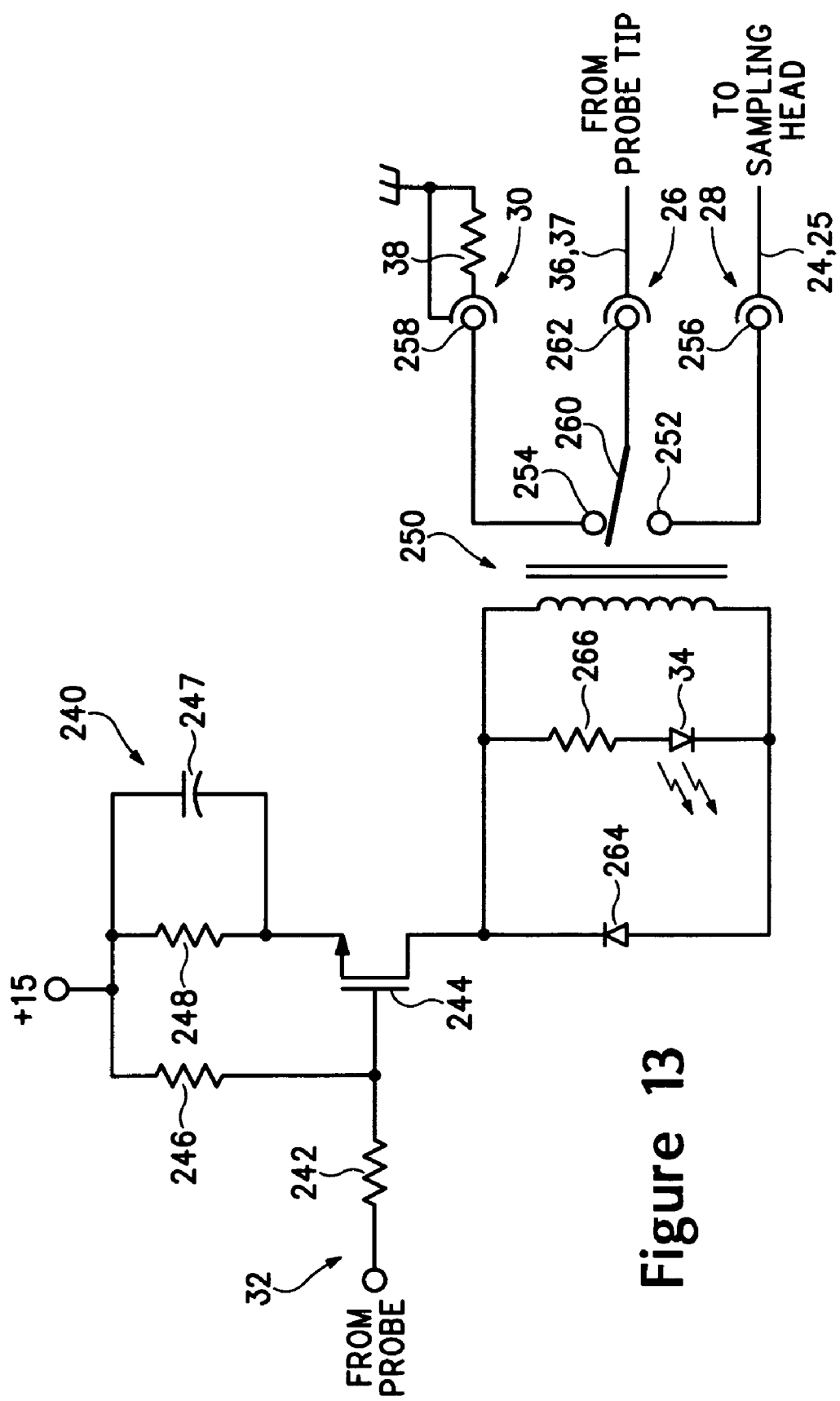
FIG. 13 is a schematic representation of the of the control circuitry in the control modules coupled to the differential measurement probe for passing an activation signal to an EOS/ESD protection control module according to the present invention.

The second electrically conductive contacts 182, 194 of the first and second pressure sensors 142, 143 abut the rear end wall 210 of the recess 112 as best shown in FIG. 11. The second electrically conductive contacts 182, 194 are formed of an electrically conductive material, such as brass, copper or the like, that is plated with a layer of gold. The second electrically conductive contact 182 of the first pressure sensor 142 has a lateral dimension that allows both the first electrically conductive contacts 180 and 190 of the first and second pressure sensors 142, 143 to engage the second electrical contact 182. An insulating member 220 is positioned between the second electrically conductive contact 182 of the first pressure sensor 142 and the second electrically conductive contact 194 of the second pressure sensor 143. An insulated wire 204 electrically couples the electrically conductive contact 194 of the second pressure sensor to the plug receptacles 48, 49 mounted on the differential measurement probe 10. Alternately, the insulated wire 204 may be electrically coupled to the electrically conductive contact 182 of the first pressure sensor 142 if the first electrically conductive contact 180 of the first pressure sensor 142 is electrically insulated from the semi-rigid coaxial cable 148 of the first coaxial probe assembly 140 and the first electrically conductive contact 190 of the second pressure sensor 143 is electrically coupled to the semi-rigid coaxial cable 148 of the second coaxial probe assembly 141.

The forces applied to the coaxial probe assemblies 140, 141 by the first compressive elements 144, 146 and the second compressive elements 145, 147 are similar to the forces applied by the embodiment of FIG. 5. Each compression spring 206 of the first compressive elements 144, 146 exerts a pre-loaded compressive force $F_1$ on each of the coaxial probe assemblies 140, 141 as represented by the force $F_1$ in FIG. 7B. Downward movement of the probe housing 100 compresses each of the compression springs 206 as represented by the sloping line $K_1$. As previously stated, the forces applied to each of the coaxial probe assemblies 140, 141 and correspondingly to the probing tips 154 is the combination of the pre-loaded compressive force $F_1$ plus the increasing force required by the spring constant $K_1$ of the respective compression springs 206. The downward movement of the probe housing 100 causes the second electrically conductive contacts 182, 194 of the pressure sensors 142, 143 to move toward the first electrically conductive contacts 180, 190 of the first and second pressure sensors 142, 143. When the first electrically conductive contacts 180, 190 are brought into contact with the second electrically conductive contacts 182, 194, the activation signal is passed to the plug receptacles 48, 49 via the insulated wire. At the same time, the compression springs 216, 217 generate the pre-loaded compressive force $F_2$ against the second electrically conductive contacts 182, 194 of the pressure sensors 142, 143. The pre-loaded compressive forces $F_2$ generates an immediate increase in force on the coaxial probe assemblies 140, 141 as represented by the vertical force line F2 extending from the $K_1$ line in FIG. 7B. This increase in force on the coaxial probe assemblies 140, 141 has a noticeable tactile feel for a user. The user feels the need to apply greater downward force on the probe housing 100 to move the probe housing relative to the coaxial probe assemblies 140, 141. Further, an increasing downward force is required to move the probe housing relative to the coaxial probe assemblies 140, 141 because of the additive properties of the spring constants of the compression springs 206, and 216, 217 as represented by the sloping line $K_1+K_2$. Continued downward force on the probe housing 100 will cause the first electrically conductive contact 180 and the rectangular block 191 to move along the semi-rigid coaxial cables 148 as a result of the pressure applied by the second electrically conductive contacts 182 194. Continued downward force on the probe housing 100 will eventually cause the second electrically conductive contacts 182, 194 of the pressure sensors 142, 143 to apply sufficient force on the first electrically conductive contact 180 and the rectangular block 191 to completely compress the compression springs 216, 217. Any continued downward pressure on the probe housing 100 transfers the force directly to the coaxial probe assembly 140 as represented by the vertical force line $F_4$ and not taken up by the compression springs.

Referring to FIG. 10, there is shown an assembled differential measurement probe 10. The first and second housing members 102, 104 are secured together to captures the coaxial probe assemblies 140, 141 within the hosing 100 with the probing tips 154 extending out of end 108 and the coaxial threaded connectors 156 extending out of end 110. Positioned over the end 110 of the housing 100 is a bracket 222 that is attached to one of the anti-rotation blocks 162, 163 using threaded screws. Mounted on the bracket are the plug receptacles 48, 49 with each plug receptacle 48, 49 having an electrical contact 225, 226. The second plug connectors 46, 47 of the electrical conductors 44, 45 each have an electrical contact 223 224 that are electrically connected to the electrical contacts 225, 226 of the plug receptacles 48, 49 when mated. The insulated wire 204 that is electrically coupled to the second electrically conductive contact 194 of the second pressure sensor 143 is electrically coupled to the electrical contacts 225, 226 of the plug receptacles 48, 49 for coupling the activation signal to the control modules 12, 13.

Referring to FIG. 11, there is shown a schematic representation of control circuitry 240 in the control modules 12 and 13. Each control module 12, 13 functions in the same manner and provides EOS/ESD protection to one of the first and second input channels of the sampling head 18 in the measurement test instrument 10. Each control module 12 and 13 receives the activation signal from the differential measurement probe 10 via the electrically conductive input connector 32 connected to respective electrical contacts 42, 43 of the plug connectors 40, 41 that are connected to the electrical conductors 44, 45. The activation signal from the differential measurement probe 10 is coupled through resistor 242 to the control terminal of a high input impedance transconductance device 244. In the preferred embodiment, the high input impedance transconductance device 244 is a p-channel MOS field effect transistor, such as manufactured and sold by Tektronix, Inc. under Part No. 151-1120-00. Alternately, the high input impedance transconductance device 244 may be a CMOS logic gate controlling a power circuit. A bias resistor 246 is coupled between the control terminal of the high input impedance transconductance device 244 and a voltage supply. The voltage supply is also supplied to the current output of the high input impedance transconductance device 244 through power supply resistor 248 and charging capacitor 247. The output of the high input impedance transconductance device 244 is coupled through a RF relay switch 250. Relay switch contacts 252 and 254 are respectively coupled to the signal conductors 256 and 258 of the coaxial output terminal 28 and a coaxial termination terminal 30. The armature contact 260 is coupled to the signal conductor 262 of the coaxial input terminal 26. A shunt diode 264 is coupled in parallel with the RF relay switch 250. A series connected resistor 266 and light emitting diode used as the optional visual indicator 34 may be coupled in parallel with the RF relay switch 250.

The operation of the differential measurement probe 10 will be described with a p-channel MOSFET as the high input impedance transconductance device 244. The spring loaded coaxial probe assemblies 140, 141 of the differential measurement probe 10 are coupled to one of the respective coaxial input terminals 26 of the control modules 12 and 13 via coaxial cables 36 and 37. The central signal conductors 150 of the semi-rigid coaxial cables 148 of the first and second coaxial probe assemblies 140, 141 are coupled to the signal conductors 262 of the coaxial input terminals 26 of the control modules 12 and 13. The outer shielding conductors 152 of the semi-rigid coaxial cables 148 are coupled to electrical ground through the outer shielding conductor of the coaxial cable 36, 37 and the coaxial input terminals 26. The first and second pressure sensors 142, 143 are coupled to the input of the p-channel MOSFETs 244 via the electrical conductors 44, 45 and the contacts 42, 43 of the input connectors 40, 41. The first and second pressure sensors 142, 143 function as a logical AND gate for the input circuitry of the p-channel MOSFET 244. The first and second pressure sensors 142, 143 presents an open circuit to the gate of the p-channel MOSFET in the standby mode when neither of the first and second electrically conductive contacts 180, 182, 190, 194 of the first and second pressure sensors 142, 143 are engaged or when the first and second electrically conductive contacts of one or the other of the first and second pressure sensors 142, 143 are engaged. The open circuit biases the p-channel MOSFET 244 to the off state by coupling supply voltage through the biasing resistor 246 to the gate of the MOSFET.

A user positions the differential measurement probe 10 is on the device under test 54 with the probing tips 154 contacting the circuit traces 50. The probing tips 154 are coupled to electrical ground through the armatures and switch contacts 260 and 254 and the 50 ohm termination resistors 66 of the control modules 12 and 13 to discharge any ESD and EOS voltages on the device under test 54. Pressure applied to the probing tips 154 of the differential measurement probe 10 in contact with a device under test 54 causes movement of the housing 100 relative to the coaxial probe assemblies 140, 141. The movement of the housing 100 brings the second electrically conductive contacts 182, 194 of the first and second pressure sensors 142, 143 into contact with the first electrically conductive contacts 180, 190 of the first and second pressure sensors 142, 143. The engagement of the first and second electrically conductive contacts 180, 182 and 190, 194 of the first and second pressure sensors 142, 143 couples electrical ground into the input circuitry of the p-channel MOSFETs 244 of control modules 12 and 13 producing voltage divider networks that includes biasing resistors 246, input resistors 242 and the resistances of the first or second pressure sensors 142, 143. The voltage drop across biasing resistors 246, which in the preferred embodiment has a high resistive value of approximately 4.7 megohms, causes the p-channel MOSFETs 244 to conduct and apply pull-in currents and voltages to the coils of the RF relays 250 that closes the contacts 260 and 252 of the control modules 12 and 13 and couple the probing tips 154 of the differential measurement probe 10 to the first and second input channels of the sampling head 18. The RF relays 250 requires a 30 ma pull-in current at +15 volts to initially move the armatures 260 from the normally closed contacts 254 to the normally open contacts 252. Smaller holding currents and voltages are supplied to the RF relays 250 of the control modules 12 and 13 by the RC circuits made of charging capacitors 247 and resistors 248. The current outputs of the p-channel MOSFETs are also coupled through resistors 266 and LEDs 34 of the control modules 12 and 13 to provide visual indications that the probing tips 154 are coupled to the channel inputs of sampling head 18.

Reducing the differential measurement probe 10 pressure to the device under test 54 below at least one of the second pre-loaded compressive forces produced by the second compressive elements 145, 147 disengages at least one set of the electrically conductive contacts 180, 182 and 190, 194 of the first and second pressure sensors 142, 143 causing the activation signal from the differential measurement probe 10 to be removed from the input circuits of the p-channel MOSFETs 244 of the control modules 12 and 13. The voltage supplies are reapplied to the gates of the p-channel MOSFETs 244 causing the MOSFETs to shut off and remove the power to the RF coils 250, which in turn couples the probing tips 154 of the differential measurement probe 10 to electrical ground through the 50 ohm termination resistors 66. The currents from the collapsing magnetic fields of the coils are coupled through shunt diodes 264.

Figure 14:
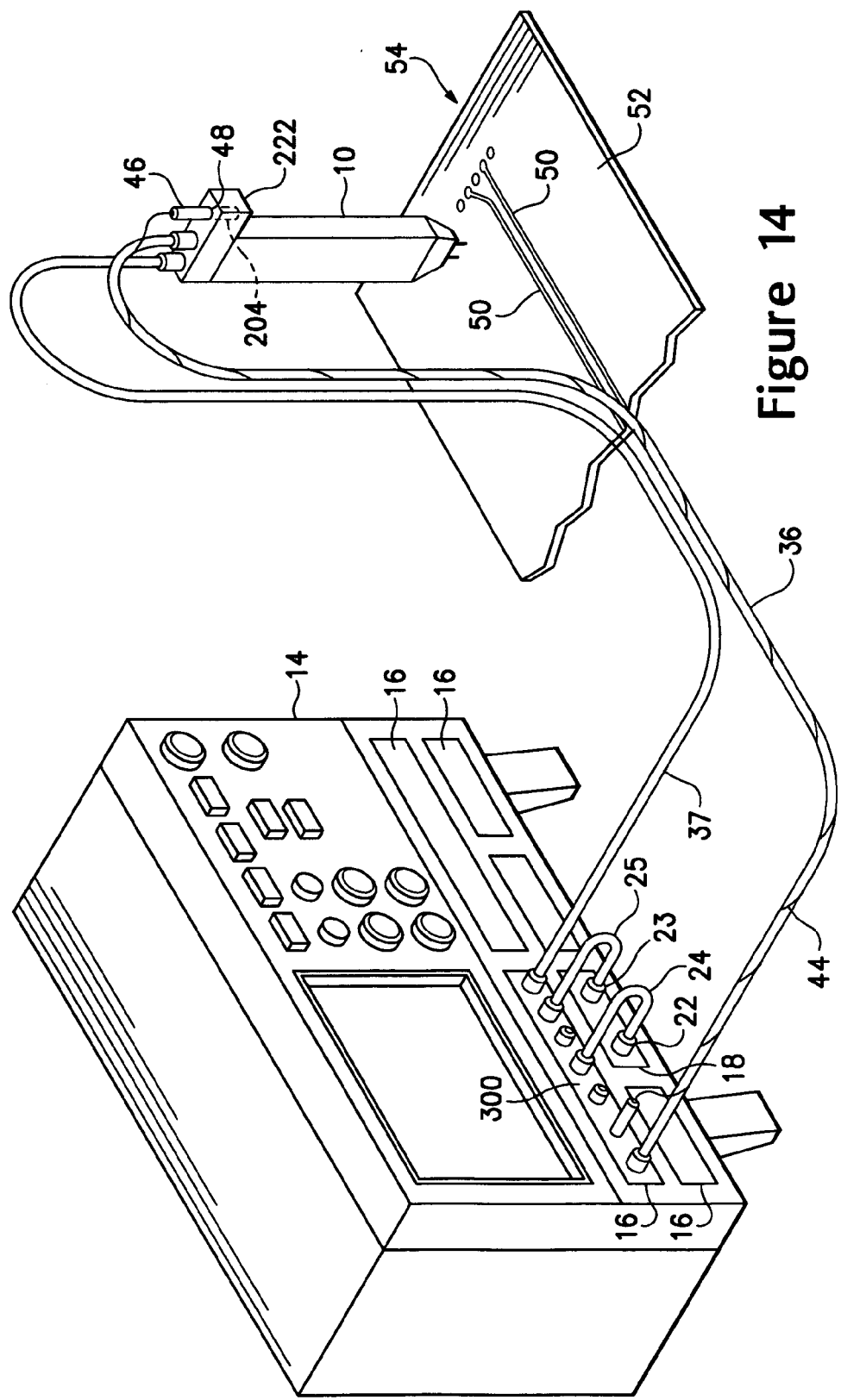
FIG. 14 is a further embodiment of the differential measurement probe for passing an activation signal to an EOS/ESD protection control module according to the present invention.
Figure 15:
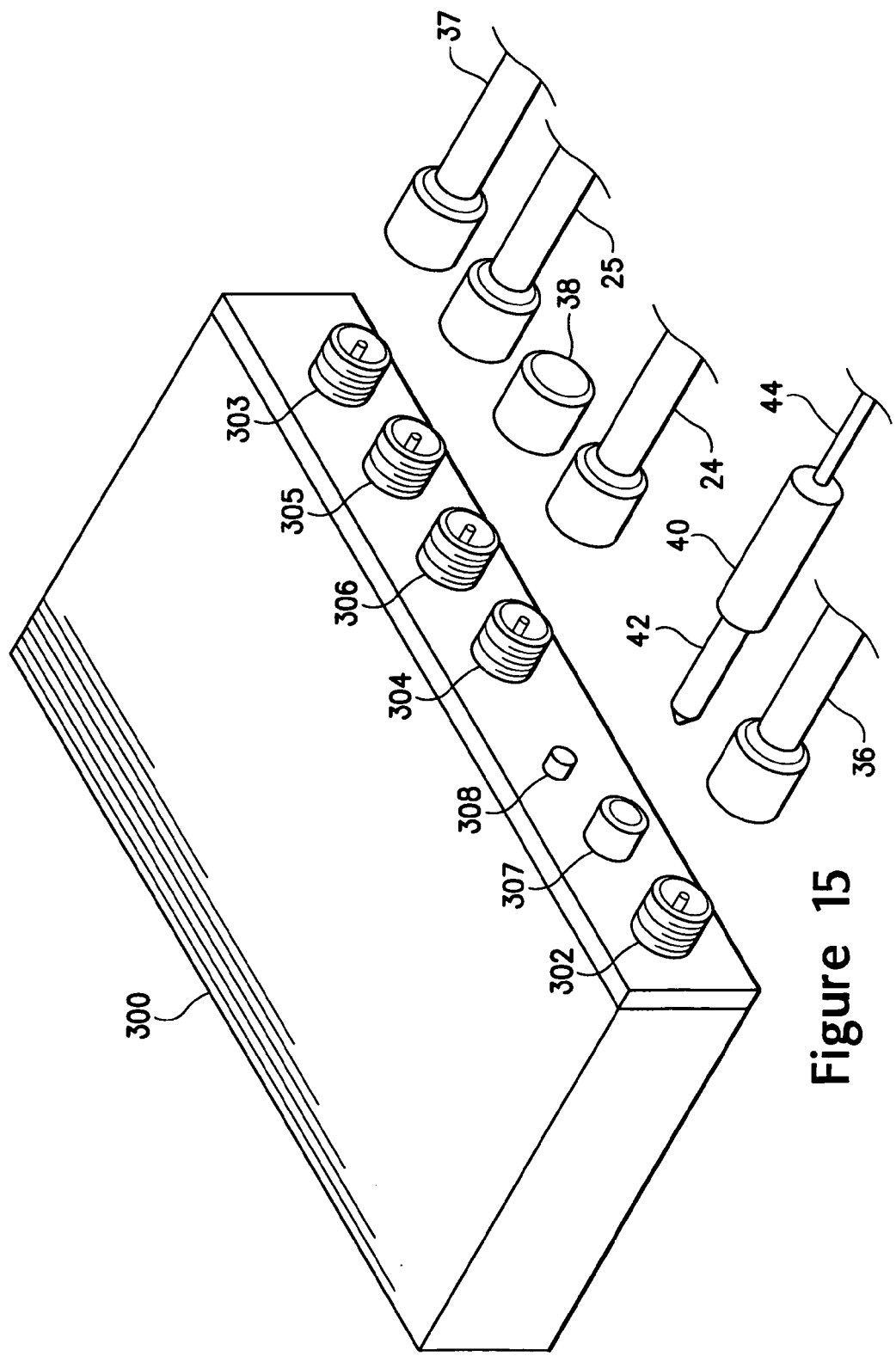
FIG. 15 is a perspective view of another EOS/ESD protection control module coupled to the differential measurement probe for passing an activation signal according to the present invention.

Referring to FIG. 14, there is shown a further embodiment of the differential measurement probe 10 for passing an activation signal to an electrical over stress (EOS) and electrostatic discharge (ESD) protection control module 300. Like elements from the previous drawings are labeled the same in FIG. 14. The first and second control modules 12, 13 of the previous embodiment is replaced with a single control module 300 disposed in a one of the bays 16 of the measurement test instrument 14. The control module 300, as best shown in FIG. 15, has coaxial input terminals 302, 303, coaxial output terminals 304, 305, and a coaxial termination terminal 306. An electrically conductive input connector 307 is also provided in the control module 300. An optional visual indicator 308, such as an LED may be secured to the control module 300 to indicate when the probing tips 154 of the differential measurement probe 10 are coupled to the sampling head 18. The coaxial input terminals 302 and 303 are coupled to the respective ends of the coaxial cables 36 and 37 whose other ends are coupled to the measurement probe 10. The output terminals 304 and 305 are coupled via the coaxial cables 24 and 25 to the input terminals of the sampling head 18. The 50 ohm termination connector 38 is secured to the coaxial termination terminal 306. The electrically conductive plug connector 40 plugs into the input connector 32. The electrical contact 42 of the plug connector 40 is electrically connected to an electrical conductor 44 having a second plug connector 46 at the other end. The second plug connector 46 is plugged into a plug receptacle 48 mounted on the differential measurement probe 10. The plug receptacle 48 on the measurement probe is mounted on the bracket 222 secured to one of the anti-rotation blocks 162, 163 of the differential measurement probe 10. The insulated wire 204 of the differential measurement probe 10 is electrically coupled to the plug receptacle 48.

Figure 16:
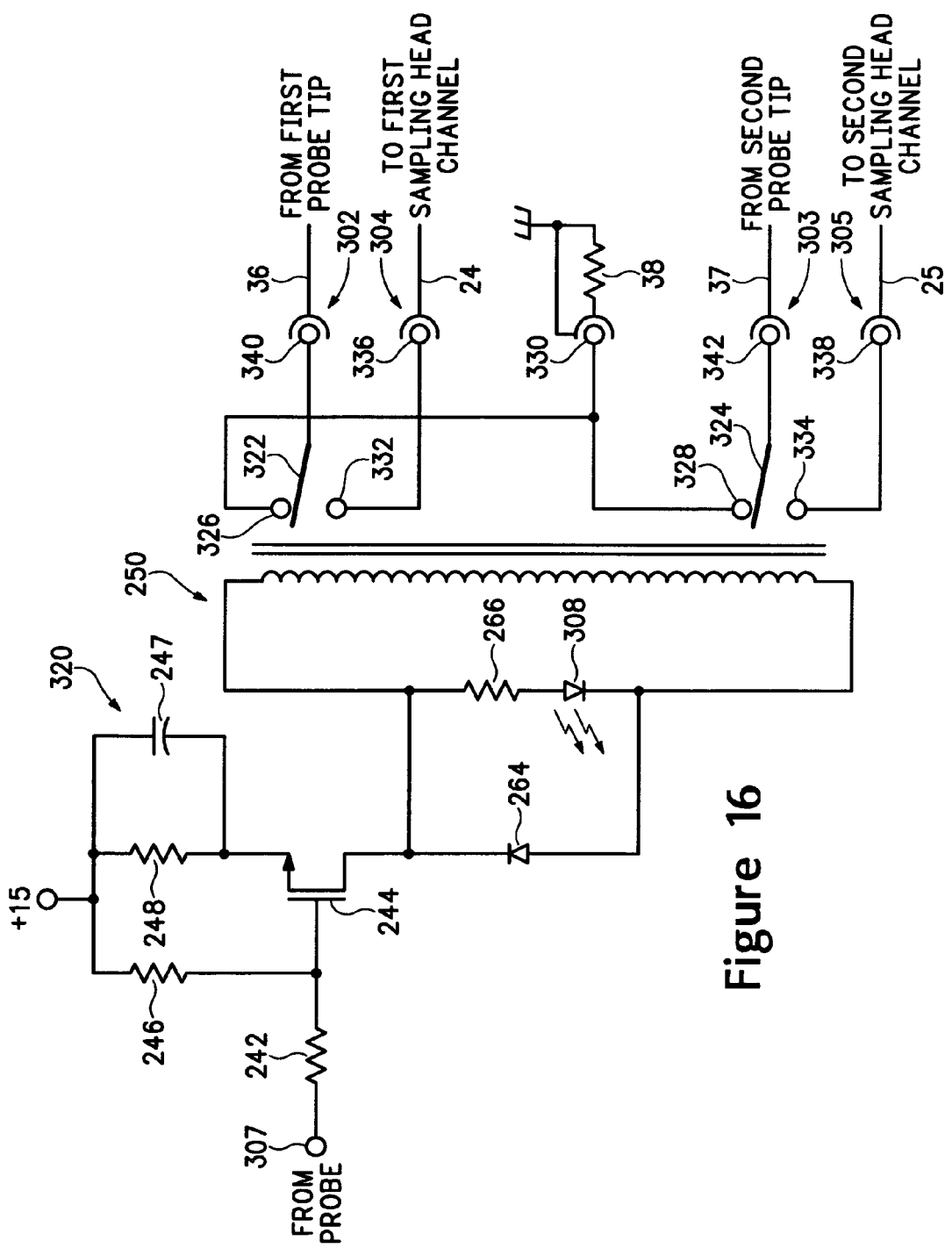
FIG. 16 is a schematic representation of the of the control circuitry in the control module coupled to the differential measurement probe for passing an activation signal to an EOS/ESD protection control module according to the present invention.

FIG. 16 shows a schematic representation of control circuitry 320 in the control module 300. Like elements from the previous drawings are labeled the same in FIG. 16. The control module 300 has the same circuit structure and functions in the same manner as the previously describe control modules 12, 13 with the exception that the RF relay switch 250 has two armatures contacts 322 and 324 instead of one. The control module 300 receives the activation signal from the differential measurement probe 10 via the electrically conductive input connector 32 connected to the electrical contact 42 of the plug connector 40 that are connected to the electrical conductor 44. Relay switch contacts 326 and 328 are coupled to the signal conductor 330 of the coaxial termination terminal 306. Relay switch contacts 332, and 334 are respectively coupled to the signal conductors 336 and 338 of the coaxial output terminals 304 and 305. The armatures contacts 322 and 324 are respectively coupled to the signal conductors 340 and 342 of the coaxial input terminals 302 and 303. In operation, the armature contacts 322 and 324 of the RF relay switch 250 are coupled to the 50 ohm termination connector 38 via the relay switch contacts 326 and 328 when the MOSFET 244 is not conducting. The activation signal causes the MOSFET 244 to conduct and apply a pull-in current and voltage to the coil of the RF relay 250 that closes the contacts 322 and 332 and 324 and 334 of the control module 300 and couple the probing tips 154 of the differential measurement probe 10 to the first and second input channels of the sampling head 18.

The present invention has been described with a electrical ground activation signal. The present invention may also be implemented using a positive or negative voltage activation signal if voltage power is provided to the measurement probe 10. In such a configuration, the first electrically conductive contacts 180 and 190 of the first and second pressure sensors 142 and 143 need to electrically insulated from the semi-rigid coaxial cables 148 with the voltage activation signal being coupled to one of the second electrically conductive elements 182 or 194 of the first and second pressure sensors 142, 143. Further, various configurations of the first and second compressive elements 144, 146 and 145, 147 have been described. Other configurations of the first and second compressive elements 144, 146 and 145, 147 using different compressive materials are contemplated where the first compressive elements generates an initial pre-loaded and increasing compressive force on the coaxial probe assemblies 140, 141 and the second compressive elements generates a second pre-loaded compressive force on the coaxial probe assemblies 140, 141 and adds an increasing compressive force on the coaxial probe assemblies 140, 141.

It will be obvious to those having skill in the art that many changes may be made to the details of the above-described embodiments of this invention without departing from the underlying principles thereof. The scope of the present invention should, therefore, be determined only by the following claims.

What is claimed is:

1. A differential measurement probe comprising:
   first and second coaxial probe assemblies with each coaxial probe assembly having a probing tip;
   a housing receiving the first and second coaxial probe assemblies with the probing tips of the first and second coaxial probe assemblies extending from one end of the housing;
   first compressible elements disposed within the housing with one of the first compressible elements applying a first pre-loaded compressive force to the first coaxial probe assembly and a first increasing compressive force by axial movement of the housing relative to the first coaxial probe assembly and the other of the first compressible elements applying a first pre-loaded compressive force to the second coaxial probe assembly and a first increasing compressive force by axial movement of the housing relative to the second coaxial probe assembly;
   second compressible elements disposed within the housing with one of the second compressible elements applying a second pre-loaded compressive force to the first coaxial probe assembly subsequent to the application of the first increasing compressive force on the first coaxial probe assembly and a second increasing compressive force by further axial movement of the housing relative to the first coaxial probe assembly and the other of the second compressible elements applying a second pre-loaded compressive force to the second coaxial probe assembly subsequent to the application of the first increasing compressive force on the second coaxial probe assembly and a second increasing compressive force by further axial movement of the housing relative to the second coaxial probe assembly; and
   first and second pressure sensors disposed in the housing for passing an activation signal in response to the axial movement of the housing relative to the first and second coaxial probe assemblies with each of the first and second pressure sensors having a first contact associated with each of the respective coaxial probe assemblies and a second contact associated with the housing.

2. The differential measurement probe as recited in claim 1 wherein the each of the first and second coaxial probe assemblies further comprise a semi-rigid coaxial cable having a probing tip at one end and a threaded connector at the other end.

3. The differential measurement probe as recited in claim 1 wherein the housing further comprises first and second members with at least one member having first and second channels formed therein for receiving the first and second coaxial probe assemblies, the first compressible elements, the second compressible elements and the first and second pressure sensors with the first and second members being joined together to form an internal cavity.

4. The differential measurement probe as recited in claim 2 wherein each of the first compressible elements further comprises a compression spring positioned on the semi-rigid coaxial cable of each of the first and second coaxial probe assemblies with one end of the compression spring fixedly positioned to the semi-rigid coaxial cable and the other end engaging the housing with the compression spring being compressed between the fixed position on the semi-rigid coaxial cable and the housing to generate the first pre-loaded compressive force.

5. The differential measurement probe as recited in claim 2 wherein the first contact of each of the first and second pressure sensors further comprises a first electrically conductive contact positioned on an outer shielding conductor the semi-rigid coaxial cable of each of the first and second coaxial probe assemblies with one of the first electrically conductive contacts electrically coupled to the outer shielding conductor of one of the semi-rigid coaxial cables and the other first electrically conductive contact electrically insulated from the outer shielding conductor of the other semi-rigid coaxial cable and the second contact of each of the first and second pressure sensors further comprising a second electrically conductive contact disposed in the housing.

6. The differential measurement probe as recited in claim 5 wherein the first and second pressure sensors produce a logical AND function when the first electrically conductive contacts of the first and second pressure sensors engage the second electrically conductive contacts of the first and second pressure sensors.

7. The differential measurement probe as recited in claim 6 wherein the first electrically conductive contacts of the first and second pressure sensors are fixedly positioned to the outer shielding conductors of the semi-rigid coaxial cables of the first and second coaxial probe assemblies.

8. The differential measurement probe as recited in claim 6 wherein one of the second electrically conductive contacts of the first and second pressure sensors further comprises a common electrically conductive contact for electrically coupling the second electrically conductive contacts together through one of the first electrically conductive contacts of the first and second pressure sensors.

9. The differential measurement probe as recited in claim 8 wherein each of the second compressible elements further comprises a compression spring disposed within a bore of an electrically conductive housing having a movable electrical contact secured within the bore with the compression spring being compressed between the electrically conductive housing and the movable electrical contact to generate the second pre-loaded compressive force.

10. The differential measurement probe as recited in claim 9 wherein each of the electrically conductive housings receiving the compression spring and securing the movable electrical contact further comprises the one of the second electrically conductive contact of the first and second pressure sensors.

11. The differential measurement probe as recited in claim 8 wherein each of the second compressible elements comprise an elastomeric material disposed in the housing with each elastomeric material having one of the second electrically conductive contacts of the first and second pressure sensors being disposed adjacent thereto and applying a compressive force on the elastomeric material to generate the second pre-loaded compressive force.

12. The differential measurement probe as recited in claim 6 wherein each of the first electrically conductive contacts of the first and second pressure sensors are movable along the outer shielding conductors of the semi-rigid coaxial cables of the first and second coaxial probe assemblies.

13. The differential measurement probe as recited in claim 12 wherein each of the second compressible elements comprise a compression spring positioned on the semi-rigid coaxial cable of each of the first and second coaxial probe assemblies with one end of the compression spring fixedly positioned to the semi-rigid coaxial cable and the other end abutting the first electrically conductive contact of one of the first and second pressure sensors, the first electrically conductive contact engaging a spring stop on the semi-rigid coaxial cable with the second compression spring being compressed between the fixed position and the first electrically conductive contact of the pressure sensor on the semi-rigid coaxial cable to generate the second pre-loaded compressive force.

14. The differential measurement probe as recited in claim 13 wherein each of the second electrically conductive contacts of the first and second pressure sensors are fixedly positioned in the housing.

15. The differential measurement probe as recited in claim 2 wherein each of the first and second coaxial probe assemblies further comprises an attachment plate disposed on the semi-rigid coaxial cable adjacent to the threaded connector with the attachment plate secured to an anti-rotation block, the anti-rotation block being positioned within the housing.

16. The differential measurement probe as recited in claim 15 further comprising an electrical conductor coupled to one of the first and second pressure sensors.

17. The differential measurement probe as recited in claim 16 further comprising an electrical connector receptacle mounted on the differential measurement probe having an electrical contact electrically coupled to the electrical conductor.

18. The differential measurement probe as recited in claim 17 wherein the electrical connector receptacle is mounted on a bracket having a top plate and depending sidewalls with the bracket secured to one of the attachment plates.

19. The differential measurement probe as recited in claim 16 further comprising first and second electrical connector receptacles mounted on the differential measurement probe with each electrical connector receptacles having and electrical contact electrically coupled to the electrical conductor.

20. The differential measurement probe as recited in claim 19 wherein the first and second electrical connector receptacles are mounted on a bracket having a top plate and depending sidewalls with the bracket secured to one of the attachment plates.

21. A differential measurement probe coupled via first and second coaxial cables to at least a first electrical over stress and electrostatic discharge protection module with the differential measurement probe passing an activation signal to the electrical over stress and electrostatic discharge protection control module for coupling the differential measurement probe to input circuitry of the measurement test instrument comprising:

first and second coaxial probe assemblies with each coaxial probe assembly formed from a semi-rigid coaxial cable having a probing tip at one end and a threaded connector at the other end with the threaded connector being coupled to the coaxial cable;

a housing having an internal cavity extending the length of the housing and exposed at opposing ends of the housing with the first and second coaxial probe assemblies disposed within the internal cavity having the probing tips of the first and second coaxial probe assemblies extending from one end of the housing and the threaded connectors of the first and second coaxial probe assemblies extending from the other end of the housing;

first compressible elements disposed within the housing with one of the first compressible elements applying a first pre-loaded compressive force to the first coaxial probe assembly and a first increasing compressive force by axial movement of the housing relative to the first coaxial probe assembly and the other of the first compressible elements applying a first pre-loaded compressive force to the second coaxial probe assembly and a first increasing compressive force by axial movement of the housing relative to the second coaxial probe assembly;

second compressible elements disposed within the housing with one of the second compressible elements applying a second pre-loaded compressive force to the first coaxial probe assembly subsequent to the application of the first increasing compressive force on the first coaxial probe assembly and a second increasing compressive force by further axial movement of the housing relative to the first and coaxial probe assembly and the other of the second compressible elements applying a second pre-loaded compressive force to the second coaxial probe assembly subsequent to the application of the first increasing compressive force on the second coaxial probe assembly and a second increasing compressive force by further axial movement of the housing relative to the second coaxial probe assembly; and first and second pressure sensors passing an activation signal in response to the axial movement of the housing relative to the first and second coaxial probe assemblies with each of the first and second pressure sensors having a first electrically conductive contact positioned on an outer shielding conductor of one of the semi-rigid coaxial cables of the first and second coaxial probe assemblies, with one of the first electrically conductive contacts electrically coupled to the outer shielding conductor and the other first electrically conductive contact electrically insulated from the outer shielding conductor and a second electrically conductive contact disposed in the housing with one of the second electrically conductive contacts of the first and second pressure sensors coupled to the electrical over stress and electrostatic discharge protection control module via an electrical conductor;

the probing tips of the first and second coaxial probe assemblies coupled to electrical ground via the electrical over stress and electrostatic discharge protection control module prior to the first electrically conductive contacts of the first and second pressure sensors engaging the second electrically conductive contacts of the first and second pressure sensors and the probing tips coupled to the input circuitry of the measurement test instrument when the electrical over stress and electrostatic discharge protection control module receives the activation signal passed in response to the first electrically conductive contacts of the first and second pressure sensors engaging the second electrically conductive contacts of the first and second pressure sensors.

22. The differential measurement probe as recited in claim 21 wherein the housing further comprises first and second members with at least one member having first and second channels formed therein for receiving the first and second coaxial probe assemblies, the first compressible elements, the second compressible elements and the first and second pressure sensor with the first and second members being joined together such form the internal cavity.

23. The differential measurement probe as recited in claim 21 wherein each of the first compressible elements further comprises a compression spring positioned on the semi-rigid coaxial cable of each of the first and second coaxial probe assemblies with one end of the compression spring fixedly positioned to the semi-rigid coaxial cable and the other end engaging the housing with the compression spring being compressed between the fixed position on the semi-rigid coaxial cable and the housing to generate the first pre-loaded compressive force.

24. The differential measurement probe as recited in claim 21 wherein the first and second pressure sensors produce a logical AND function when the first electrically conductive contacts of the first and second pressure sensors engage the second electrically conductive contacts of the first and second pressure sensors.

25. The differential measurement probe as recited in claim 24 wherein the first electrically conductive contacts of the first and second pressure sensors are fixedly positioned to the outer shielding conductor of the semi-rigid coaxial cable of the first and second coaxial probe assemblies.

26. The differential measurement probe as recited in claim 24 wherein one of the second electrically conductive contacts of the first and second pressure sensors further comprises a common electrically conductive contact for electrically coupling the second electrically conductive contacts together through one of the first electrically conductive contacts of the first and second pressure sensors.

27. The differential measurement probe as recited in claim 26 wherein each of the second compressible elements further comprises a compression spring disposed within a bore of an electrically conductive housing having a movable electrical contact secured within the bore with the compression spring being compressed between the electrically conductive housing and the movable electrical contact to generate the second pre-loaded compressive force.

28. The differential measurement probe as recited in claim 27 wherein the electrically conductive housing receiving the compression spring and securing the movable electrical contact further comprises the second electrically conductive contact of the pressure sensor.

29. The differential measurement probe as recited in claim 26 wherein each of the second compressible elements further comprises an elastomeric material disposed in the housing with each elastomeric material having one of the second electrically conductive contacts of the first and second pressure sensors being disposed adjacent thereto and applying a compressive force on the elastomeric material to generate the second pre-loaded compressive force.

30. The differential measurement probe as recited in claim 24 wherein the first electrically conductive contacts of the first and second pressure sensors are movable along the outer shielding conductor of the semi-rigid coaxial cables of the first and second coaxial probe assemblies.

31. The differential measurement probe as recited in claim 30 wherein each of the second compressible elements further comprises a compression spring positioned on the semi-rigid coaxial cable of each of the first and second coaxial probe assemblies with one end of the compression spring fixedly positioned to the semi-rigid coaxial cable and the other end electrically coupled to the first electrically conductive contact of one of the first and second pressure sensors, the first electrically conductive contact engaging a spring stop on the semi-rigid coaxial cable with the second compression spring being compressed between the fixed position and the first electrically conductive contact of the pressure sensor on the semi-rigid coaxial cable to generate the second pre-loaded compressive force.

32. The differential measurement probe as recited in claim 31 wherein each of the second electrically conductive contacts of the first and second pressure sensors are fixedly positioned in the housing.

33. The differential measurement probe as recited in claim 21 wherein each of the first and second coaxial probe assemblies further comprises an attachment plate disposed on the semi-rigid coaxial cable adjacent to the threaded connector with the attachment plate secured to an anti-rotation block, the anti-rotation block being positioned within the housing.

34. The differential measurement probe as recited in claim 33 wherein the electrical conductor further comprises first and second insulated wire segments with the first insulated wire segment electrically coupling one of the second electrically conductive contacts of the first and second pressure sensors to an electrical contact of an electrical connector receptacle mounted on the differential measurement probe and the second insulated wire segment electrically coupling an electrical contact of a first electrical plug to an electrical contact of a second electrical plug with the first electrical plug mating with the electrical connector receptacle mounted on the differential measurement probe and the second electrical plug mating with an electrical connector receptacle having at least a first electrical contact mounted in the electrical over stress and electrostatic discharge protection control module.

35. The differential measurement probe as recited in claim 34 wherein electrical connector receptacle is mounted on a bracket having a top plate and depending sidewalls with the bracket secured to one of the attachment plates.

36. The differential measurement probe as recited in claim 33 wherein first coaxial cable of the differential measurement probe is coupled to a first electrical over stress and electrostatic discharge protection control module and second coaxial cable is coupled to a second electrical over stress and electrostatic discharge protection control module with the differential measurement probe passing the activation signal to the first and second electrical over stress and electrostatic discharge protection control modules wherein the electrical conductor further comprises a first insulated wire segment electrically coupling one of the second electrically conductive contacts of the first and second pressure sensors to respective electrical contacts of first and second electrical connector receptacles mounted on the differential measurement probe and second and third insulated wire segments with each second and third insulated wire segment having first and second electrical plugs with each first and second electrical plug having an electrical contact, the electrical contact of the first electrical plug of the second insulated wire mating with the electrical contact of the first electrical connector receptacle mounted on the differential measurement probe and the electrical contact of the second electrical plug of the second insulating wire mating with an electrical contact of an electrical connector receptacle mounted in the first electrical over stress and electrostatic discharge protection control module and the electrical contact of the first electrical plug of the third insulated wire mating with the electrical contact of the second electrical connector receptacle mounted on the differential measurement probe and the electrical contact of the second electrical plug of the third insulating wire mating with an electrical contact of an electrical connector receptacle mounted in the second electrical over stress and electrostatic discharge protection control module.

37. The differential measurement probe as recited in claim 36 wherein first and second electrical connector receptacles are mounted on a bracket having a top plate and depending sidewalls with the bracket secured to one of the attachment plates.

* * * * *